United States Patent
Rahman et al.

(10) Patent No.: US 11,421,128 B2
(45) Date of Patent: Aug. 23, 2022

(54) COMPOSITION OF SPIN-ON MATERIALS CONTAINING METAL OXIDE NANOPARTICLES AND AN ORGANIC POLYMER

(71) Applicant: RIDGEFIELD ACQUISITION, Luxembourg (LU)

(72) Inventors: M. Dalil Rahman, Flemington, NJ (US); Huirong Yao, Plainsboro, NJ (US); JoonYeon Cho, Bridgewater, NJ (US); Munirathna Padmanaban, Bridgewater, NJ (US); Elizabeth Wolfer, Bethlehem, PA (US)

(73) Assignee: Merck Patent GMBH, Darmstadt (DE)

( * ) Notice: Subject to any disclaimer, the term of this patent is extended or adjusted under 35 U.S.C. 154(b) by 651 days.

(21) Appl. No.: 16/470,711

(22) PCT Filed: Dec. 19, 2017

(86) PCT No.: PCT/EP2017/083498
§ 371 (c)(1),
(2) Date: Jun. 18, 2019

(87) PCT Pub. No.: WO2018/114920
PCT Pub. Date: Jun. 28, 2018

(65) Prior Publication Data
US 2020/0087534 A1 Mar. 19, 2020

Related U.S. Application Data

(60) Provisional application No. 62/437,449, filed on Dec. 21, 2016.

(51) Int. Cl.
*C09D 165/02* (2006.01)
*C09D 7/20* (2018.01)
(Continued)

(52) U.S. Cl.
CPC .............. *C09D 165/02* (2013.01); *C08K 3/22* (2013.01); *C09D 7/20* (2018.01); *C09D 7/67* (2018.01);
(Continued)

(58) Field of Classification Search
CPC ........................................................ G03F 7/094
See application file for complete search history.

(56) References Cited

U.S. PATENT DOCUMENTS

| 3,474,054 A | 10/1969 | White |
| 4,200,729 A | 4/1980 | Calbo |

(Continued)

FOREIGN PATENT DOCUMENTS

| JP | S62-269140 A | 11/1987 |
| JP | 2010-529499 A | 8/2010 |

(Continued)

OTHER PUBLICATIONS

Munirathna Padmanaban et al: "Progress in Spin-on Hard Mask Materials for Advanced Lithography", Journal of Photopolymer Science and Technology, vol. 27, No. 4, Jan. 1, 2014 (Jan. 1, 2014), pp. 503-509, XP055458147, JP ISSN: 0914-9244, DOI: 10.2494/photopolymer.27.503 (Year: 2014).*

(Continued)

*Primary Examiner* — Chanceity N Robinson
(74) *Attorney, Agent, or Firm* — William T. Slaven, IV

(57) ABSTRACT

A coating composition, and uses thereof, including a solvent, metal oxide nanoparticles dispersed in this solvent, and a high carbon polymer dissolved in this solvent, where the high carbon polymer includes a repeat unit of structure (1), a hydroxybiphenyl repeat unit of structure (2) and a moiety containing a fused aromatic containing moiety of structure (3) where $R_1$ and $R_2$ are independently selected from the (Continued)

group of hydrogen, an alkyl and a substituted alkyl, Ar is an unsubstituted or substituted fused aromatic ring and $X_1$ is an alkylene spacer, or a direct valence bound.

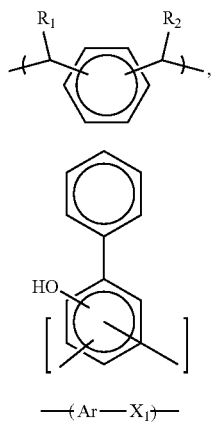

(1)

(2)

(3)

31 Claims, 3 Drawing Sheets

(51) Int. Cl.
C09D 7/40 (2018.01)
C08K 3/22 (2006.01)
G03F 7/09 (2006.01)
G03F 7/16 (2006.01)
H01L 21/027 (2006.01)

(52) U.S. Cl.
CPC ............. *G03F 7/092* (2013.01); *G03F 7/094* (2013.01); *G03F 7/162* (2013.01); *G03F 7/168* (2013.01); *H01L 21/0272* (2013.01)

(56) References Cited

U.S. PATENT DOCUMENTS

| | | | |
|---|---|---|---|
| 4,251,665 A | 2/1981 | Calbo | |
| 4,491,628 A | 1/1985 | Ito | |
| 5,187,019 A | 2/1993 | Calbo | |
| 5,350,660 A | 9/1994 | Urano | |
| 5,843,624 A | 12/1998 | Houlihan | |
| 6,447,980 B1 | 9/2002 | Rahman | |
| 6,723,488 B2 | 4/2004 | Kudo | |
| 6,790,587 B1 | 9/2004 | Feiring | |
| 6,818,258 B2 | 11/2004 | Kaneko | |
| 6,849,377 B2 | 2/2005 | Feiring | |
| 6,866,984 B2 | 3/2005 | Jung | |
| 6,916,590 B2 | 7/2005 | Kaneko | |
| 7,691,556 B2 | 4/2010 | Wu | |
| 7,727,902 B2 | 6/2010 | Takei et al. | |
| 7,932,018 B2 | 4/2011 | Mckenzie | |
| 7,981,594 B2 | 7/2011 | Yoon et al. | |
| 8,017,396 B2 | 9/2011 | Kumar | |
| 8,691,925 B2 | 4/2014 | Wu | |
| 8,906,590 B2* | 12/2014 | Rahman | C09D 165/00 430/913 |
| 9,152,052 B2 | 10/2015 | Noya | |
| 9,201,305 B2* | 12/2015 | Rahman | H01L 21/0276 |
| 2004/0150865 A1 | 8/2004 | Chen | |
| 2009/0166612 A1 | 7/2009 | Cain | |
| 2009/0230380 A1 | 9/2009 | Leon | |
| 2010/0119979 A1 | 5/2010 | Rahman | |
| 2011/0039105 A1 | 2/2011 | Zimmerman | |
| 2011/0250387 A1 | 10/2011 | Zagdoun | |
| 2012/0251943 A1 | 10/2012 | Rahman | |
| 2013/0108833 A1 | 5/2013 | Brink | |
| 2014/0045323 A1 | 2/2014 | Gonen Williams | |
| 2014/0370444 A1* | 12/2014 | Rahman | G03F 7/0757 430/311 |
| 2015/0069014 A1 | 3/2015 | Kimura | |
| 2016/0358777 A1 | 12/2016 | Hatakeyama | |
| 2020/0356006 A1* | 11/2020 | Yao | C23C 18/1295 |

FOREIGN PATENT DOCUMENTS

| | | |
|---|---|---|
| JP | 2014-515121 A | 6/2014 |
| JP | 2016-532739 A | 10/2016 |
| WO | 2005064403 A | 7/2005 |
| WO | WO2012018847 A2 | 2/2012 |
| WO | WO2012131479 A1 | 10/2012 |

OTHER PUBLICATIONS

Danilo De Simone et al: "Novel metal-oxide photoresist materials for extreme UV lithography", SPIE Newsroom, Jul. 1, 2016 (Jul. 1, 2016), XP055458177, DOI: 10.1117/2.1201606.006534 (Year: 2016).*
De Simone, et al, "Novel metal-oxide photoresist materials for extreme UV lithography," SPIE Newsroom, Jul. 1, 2016.
Kudo, et al, "Development of Spin-On-Carbon Hard Mask for Advanced Node," Proceedings of SPIE published by The International Society for Optical Engineering 9051:90511X—Mar. 2014.
Padmanaban, et al, "Progress in Spin-on Hard Mask Materials for Advanced Lithography," Journal of Photopolymer Science and Technology, vol. 27, No. 4 (2014) 503-509.
International Search Report, PCT/EP2017/083498, dated Jul. 6, 2018, corresponds to U.S. Appl. No. 16/470,711.
International Written Opinion, PCT/EP2017/083498, dated Jul. 6, 2018, corresponds to U.S. Appl. No. 16/470,711.
English Abstract of JPS62-269140A, Nov. 21, 1987.
English translation of JP Office Action dated Jul. 9, 2021.

* cited by examiner

COMPOSITION OF SPIN-ON MATERIALS CONTAINING METAL OXIDE NANOPARTICLES AND AN ORGANIC POLYMER

This application is a national stage application, filed under 35 U.S.C. § 371, of International Patent Application No. PCT/EP2017/083498, filed on Dec. 19, 2017, which claims the benefit of U.S. Provisional Patent Application No. 62/437,449, filed Dec. 21, 2016, each of which applications is incorporated herein by reference in their entirety.

The present invention relates to a hard mask coating composition comprising a high carbon polymer, metal oxide nanoparticles and a solvent where the polymer comprises in the backbone of the polymer at least one phenyl unit, at least one hydroxybiphenyl unit, and at least one substituted or unsubstituted fused aromatic ring, and a process for forming an image using the hard mask coating. The process is especially useful in microlithographic processes requiring a hard mask coating material which has good Via and Trench filling properties an which also has high temperature stability. The invention also related to the use of coatings on semiconductor substrates derived from solutions comprised of metal oxide nanoparticles and a metal hard mask which may be patterned and this patterned hard mask used to transfer a pattern into a subtracted through an etch process.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing from about the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques.

Underlayers containing high amount of refractory elements can be used as Hard Masks. Such Hard masks are useful when the overlying photoresist is not capable of providing high enough etch resistance to dry etching that is used to transfer the image into the underlying semiconductor substrate. This is made possible because the organic photoresist is different than the underlying hard mask and it is possible to find an etch gas mixture which will allow the transfer of the image in the photoresist into the underlying hard mask. This patterned hard mask can then be used with appropriate etch conditions and gas mixtures to transfer the image from the hard mask into the semiconductor substrate, a task which the photoresist by itself with a single etch process could not have accomplished. Spin on hard masks based on silicon such as TEOS (tetraethoxysilane) and other similar silicon compounds based on low Mw materials may be used, but these are generally materials which can only form thin coatings on a substrate and are consequently unable to fill voids in patterned films containing topography such as Via and Trench patterns. Higher Mw Polymers containing refractory element are limited in their etch resistance because to maintain solubility of these Polymers in spin casting solvent, requires that they have incorporated into their structures organic solubility enhancing moieties at the cost of a decreased etch resistance. An example of such materials are oligomeric or polymeric complexes of carboxylates of metal oxides such as Zirconium oxide and the like.

The present invention relates to a novel spin coatable hard mask coating compositions which are comprised of metal oxide nanoparticles, a specific high carbon polymer which is both soluble and compatible with the nanoparticle dispersion in the same solvent forming a stable solution, able to coat films with high metal content and improve etch resistance towards oxygen plasmas. These novel compositions are useful as in Via or Trench filling applications, particularly when these features have a high aspect ratio. Coating from these novel compositions have both a high temperatures stability and a high refractory metal oxide content after cure. This imparts to these cured films a high etch resistance toward oxygen plasmas because of this high metal content. Crucially, these novel spin coating composition are also solutions are stable and spin-coatable from standard spin coating solvents, while still maintaining in the cured film a very high content of metal oxide.

Typically, the novel composition is coated on a substrate having topography such as Vias, Trenches or other topographical features having a high aspect ratio. This topography may be topography produced by imaging an organic photoresist or any other topography produced by other methods such as other organic imaging materials imaginable by X-ray, electron beam resists, x-ray resists, particle beam and the like. Also, topography features produced by imaging assisted by directed self-assembly of an organic materials or alternatively produced by nanoimprinting may be used.

The novel compositions have the unexpected property of being able to blend together forming stable solution in the same solvent without phase separation in the same solvent the disparate components, a high carbon polymers of a specific structures, and metal oxide nanoparticle. These novel composition also unexpectedly form good films which have high metal content and also have excellent VIA and Trench filling properties. The improved etch resistance is because these novel hard mask composition unexpectedly allow for the blending in one stable solution of both a high carbon polymer and a suspension of metal oxide nanoparticles which each have better etch resistance towards oxygen plasmas because of their high metal content, than organic materials containing refractory element solubilized by moieties with high aliphatic and oxygen content such as carboxylates and the like. Consequently, in a novel process of using this novel compositions as patterned coatings offer improved pattern transfer into the substrate during oxygen plasma etching in those areas not covered by the novel hard mask composition. In a another inventive process these novel compositions may be coated on semiconductor and then coated with a photoresist, and optionally a bottom antireflective coating, where in a further step the resist is patterned and the patterned resist employed in an etching process to pattern the underlying coating of the novel composition. In a final step in this patterned coating of the novel composition can be used in an etch process to pattern the underlying semiconductor substrate. In yet another inventive process, a dispersion of metal oxide nanoparticles is used to create a coating on a semiconductor substrate. This coating of metal oxide nanoparticles is then patterned with a photoresist as described above, to create a patterned hard mask of metal oxide nanoparticle which may be used to selectively etch the underlying semiconductor substrate with a plasma.

SUMMARY OF THE INVENTION

The invention relates to a hard mask coating composition comprising an organic solvent, metal oxide nanoparticles dispersed in this organic solvent, a high carbon polymer component dissolved in this organic solvent, where the polymer comprises a repeat unit of structure (1), a hydroxybiphenyl repeat unit of structure (2) and an moiety containing a fused aromatic of structure (3) wherein $R_1$ and $R_2$ are independently selected from the group consisting of hydrogen, an alkyl and a substituted alkyl, Ar is an unsubstituted or substituted fused aromatic ring and $X_1$ is an alkylene spacer, or a direct valence bond.

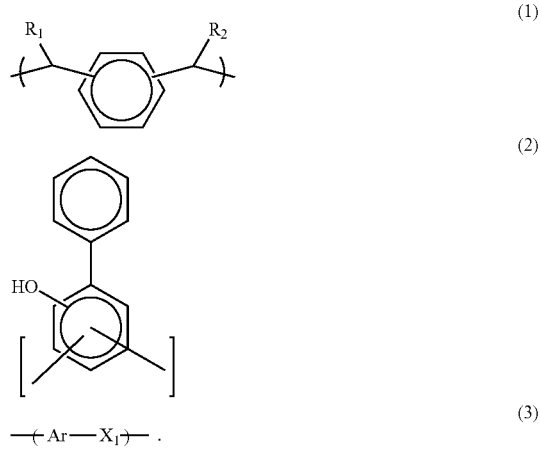

The invention also relates to a general process of coating the novel composition on a substrate and also a first etch mask process of Tone Inversion using the novel hard mask composition. In this first etch mask process, the novel composition is coated over a semiconductor substrate which is coated with a patterned organic coating. This patterned organic coating may be a patterned spin on carbon coating, a patterned photoresist and the like. The pattern is which contains topographical, such as Vias and Trenches that may be filled. During coating and subsequent processing, the novel composition is able to fill these topographical features. These filled features form a patterned hard mask which is used as an etch barrier during an etching process which etches away the semiconductor substrate in areas not filled with the novel hard mask composition, forming a negative image of the original topographical features into the substrate. The metal hard masks made from this first process have a high metal content.

The invention also further comprises a second etch mask process in which a composition comprised of metal oxide nanoparticle dispersed in a solvent is used to coat a metal hard mask to enable pattern transfer during subsequent etching processes.

Finally, the invention also comprises a third etch mask process in which a dispersion of metal oxide nanoparticle in a solvent is used to coat the semiconductor substrate. This metal hard mask is used to enable pattern transfer during subsequent etching process processes in a manner analogous to the second etch mask process. Metal hard masks made from this third process have both a high metal content and very low shrinkage during process bakes.

DETAILED DESCRIPTION OF THE INVENTION

Figure 1:
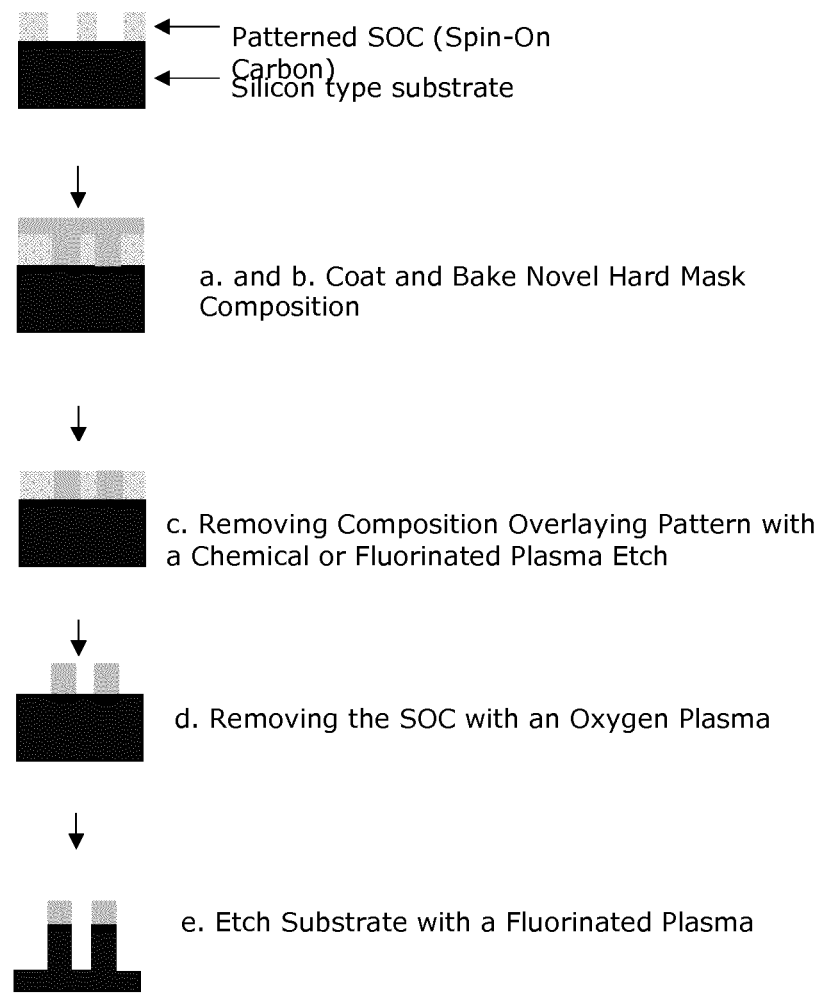
FIG. 1. Tone Inversion Application Hard Mask Process
a. Applying the coating of the novel hard mask composition comprised of metal oxide nanoparticles and high carbon polymer onto a silicon substrate.
b. Baking the film at a temperature.
c. Removing the composition overlaying the top of the patterned substrate with a chemical stripper or with a fluorinated plasma etch.
d. Removing the patterned spin on carbon with an oxygen plasma, thereby forming a negative tone image of the original patterned photoresist.
e. Etch into the substrate with a fluorine plasma.

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "component" encompass components comprising one unit or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Herein, unless otherwise indicated, alkyl refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like) multicyclic (e.g. norbornyl, adamantly and the like). These alkyl moieties may be substituted or unsubstituted as described below. The term alkyl refers to such moieties with C-1 to C-20 carbons. It is understood that for structural reasons linear alkyls start with C-1, while branched alkyls and linear start with C-3 and multicyclic alkyls start with C-5. Moreover, it is further understood that moieties derived from alkyls described below such as alkyloxy, haloalkyloxy have the same carbon number ranges unless otherwise indicated.

Alkyloxy (a.k.a. Alkoxy) refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br, I which is linked by one bond to a an organic moiety.

Haloalkyl refers to a linear, cyclic or branched saturated alkyl group such as defined above in which at least one of the hydrogens has been replaced by a halide selected from the group consisting of F, Cl, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g. trifluoromethyl, pefluoroethyl, 2,2,2-trifluoroethyl, prefluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g. trifluoromethyoxy, perfluoroethyloxy, 2,2,2-trifluoroethoxy, perfluorocyclohexyloxy and the like). These fluoroalkyl moieties, if not pefluorinated may, be substituted or unsubstituted as described below.

Herein when referring to an alkyl, alkyloxy, fluoroalkyl, fluoroalkyloxy moieties with a possible range carbon atoms which starts with C-1 such as for instance "C-1 to C-20 alkyl," or "C-1 to C-20 fluoroalkyl," as a non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

Herein the term alkylene refers to hydrocarbon groups which can be a linear, branched or cyclic which has two attachment points (e.g. methylene, ethylene, 1,2-isopropylene, a 1,4-cyclohexylene and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

Herein the term Aryl or aromatic groups refers to such groups which contain 6 to 24 carbon atoms including phenyl, tolyl, xylyl, naphthyl, anthracyl, biphenyls, bisphenyls, tris-phenyls and the like. These aryl groups may further be substituted with any of the appropriate substituents e.g. alkyl, alkoxy, acyl or aryl groups mentioned hereinabove.

Herein the term arylene refers to a aromatic hydrocarbon moiety which has two or more attachment points (e.g. 2-5), this moiety may be a single benzene moiety (e.g. 1,4-phenylene, 1,3-phenylene and 1,2-phenylene), a polycyclic aromatic moiety with two attachment points such derived from naphtalene, anthracene, pyrene and the like, or a multiple benzene rings in a chain which have two attachment point (e.g. biphenylene). In those instance where the aromatic moiety is a fused aromatic ring, these may be called fused ring arylenes, and more specifically named, for instance, napthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5-10 carbon atoms.

Herein the term fused aromatic ring refers to a carbon based polycyclic aromatic compound containing 2-8 carbon based aromatic rings fused together (e.g. naphthalene, anthracene, and the like) these fused aromatic ring which may have a single attachment point to an organic moiety as part of an aryl moiety such as a pendant fused aromatic ring aryl group on a polymer or have two attachment points as part of an arylene moiety, such as, for instance, in the backbone of a polymer.

Unless otherwise indicated in the text, the term "substituted" when referring to an aryl, alkyl, alkyloxy, fluoroalkyl, fluoroalkyloxy or fused aromatic ring refers to one of these moieties which also contain with one or more substituents, selected from the group consisting of unsubstituted alkyl, substituted alkyl, unsubstituted aryl, substituted aryl, alkyloxy, alkylaryl, haloalkyl, halide, hydroxyl, amino and amino alkyl. Similarly, the term "unsubstituted" refers to these same moieties wherein no substituents apart from hydrogen is present.

Unless otherwise indicated, the term "high carbon polymer," or "high carbon polymer component," refers to the polymer component of the inventive compositions which is comprised of repeat units having structure (1), (2) and (3) in all its embodiments as described below, unless otherwise indicated.

The invention relates to a hard mask coating composition comprising metal oxide coating composition comprising metal oxide nanoparticles dispersed in an organic solvent, a high carbon polymer dissolved in the organic solvent where the polymer comprises a repeat unit of structure (1), a hydroxybiphenyl repeat unit of structure (2) and an moiety having structure (3) which contains a fused aromatic ring Ar, wherein $R_1$ and $R_2$ are independently selected from the group consisting of hydrogen, an alkyl and a substituted alkyl, Ar is an unsubstituted or substituted fused aromatic ring and $X_1$ is an alkylene spacer, or a direct valence bound.

The term "spin on carbon," refers to a high carbon content polymer (a.k.a. equal or greater than 75 wt. % carbon), Non limiting examples of such materials are generally polymer what are soluble in spin casting solvent that have high carbon content by virtue of high contents of aromatic, alicyclic content, high fullerene content or mixtures thereof. Non limiting examples are those described in U.S. Pat. No. 8,906,590B2, 20120251943A1, U.S. Pat. Nos. 9,152,051, 8,691,925 B2, 8,017,396B2, 7,932,018B2, US2010119979, and commercial materials such as Spin on Carbon Hardmasks available from Micro-Chem Corp (Westborough, Mass.), and other commercial vendors, or as described in the recent review articles "Development of Spin-On-Carbon Hard Mask for Advanced Node Proceedings of SPIE published by The International Society for Optical Engineering 9051:90511X • March 2014."

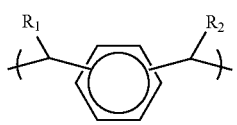
(1)

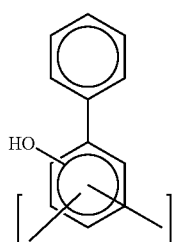
(2)

(3)

In one embodiment of the composition structure (1) in the high carbon polymer may have the more specific structure (1a)

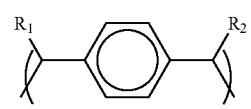
(1a)

In another embodiment of the composition structure (2) in the high carbon polymer may have structure (2a).

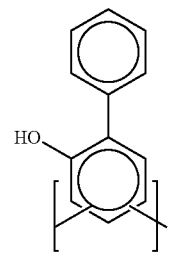
(2a)

In the high carbon polymer of the composition comprises at least one repeat unit A represented structure (3), one repeat unit B which has structure (1) and one repeat unit C has structure (2).

In one embodiment of this invention the above polymer may be one wherein the polymer comprises a unit represented by structure (4) wherein A has structure (3), B has structure (1) and C has structure (2).

(4).

In one aspect of this invention the above described embodiments of the high carbon polymer may be ones in which, in structure (3), $X_1$ is an alkylene spacer. In this particular embodiment, as shown in structure (3a), the fused aromatic ring, Ar, comprises 2 or more aromatic units fused together to form a fused ring arylenes, for instance, napthalenylene, anthracenylene, pyrenylene and the like. In another embodiment the fused aromatic moiety may comprise 2-8 aromatic rings or 2-6 aromatic rings or 3-5 aromatic rings or 3-4 aromatic rings. The fused aromatic ring may comprise 3 aromatic rings. In one specific embodiment the fused aromatic ring may be anthracenylene (a.k.a. divalent arylene of anthracene).

[—Ar—CH$_2$—] (3a).

In another embodiment the aromatic ring, Ar, in structure (3a) has 2 to 5 aromatic rings. In another embodiment the aromatic ring, Ar, in structure (3a) said fused aromatic ring, Ar, has 3 or 4 aromatic rings. In yet another embodiment the aromatic ring, Ar, in structure (3a) said fused aromatic ring, Ar, has 4 aromatic rings. In another embodiment the aromatic ring, Ar, in structure (3a) said fused aromatic ring, Ar, has 5 aromatic rings. In another embodiment the aromatic ring, Ar, in structure (3a) said fused aromatic ring, Ar, has 3 aromatic rings. In yet another embodiment the aromatic ring, Ar, in structure (3a) said fused aromatic ring, Ar, is anthracene. In another embodiment the aromatic ring, Ar, in structure (3a) said fused aromatic ring fused aromatic containing moiety has structure (3b).

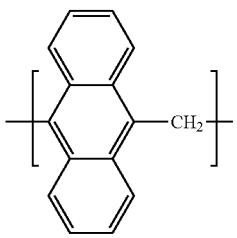

(3b)

In another aspect of the above described embodiments of the high carbon polymers, these are ones in which, in structure (3), $X_1$ is a direct valence and where moiety containing a fused aromatic ring may be represented by structure (4), where Ar is a fused ring arylene moiety which may comprise 2-8 fused aromatic rings. In another embodiment the aromatic ring, Ar, in structure (4) has 2 to 5 aromatic rings. In another aspect of this embodiment the aromatic ring, Ar, in structure (4) said fused aromatic ring, Ar, has 3 or 4 aromatic rings. In yet another embodiment the aromatic ring, Ar, in structure (4) said fused aromatic ring, Ar, has 4 aromatic rings.

In still another embodiment the aromatic ring, Ar, in structure (4) said fused aromatic ring, Ar, has 5 aromatic rings. In still another embodiment the aromatic ring, Ar, in structure (4) said fused aromatic ring, Ar, has 3 aromatic rings. In a final embodiment, Ar, is pyrene (a.k.a. the fused ring arylene, pyrenylene).

(4)

In another embodiment the above described high carbon polymer in the novel composition it may be comprised of an additional unit, D, which is a fused aromatic unit of structure (5) (a.k.a. fused ring arylene) attached only through its aromatic moiety as part of the backbone of the moiety of the polymer. In another aspect of this embodiment Ar' may comprise 2-8 fused aromatic rings. In a further aspect, Ar', is a fused aromatic ring which has 2 to 5 aromatic rings. In yet another aspect, has 3 or 4 aromatic rings. In a final aspect of this embodiment, Ar', is a fused aromatic ring which has 3 aromatic rings.

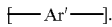

(5)

In all the above embodiments Ar and/or Ar' may be unsubstituted containing only hydrogen substituents. In another aspect of this invention Ar and/or Ar' may substituted with a substituent selected from the group consisting of unsubstituted alkyl, substituted alkyl, unsubstituted aryl, substituted aryl, alkylaryl, haloalkyl, halide, hydroxyl, amino and amino alkyl and mixtures thereof. In another embodiment of this aspect of the invention the substituents on Ar' and/or Ar may be selected from an unsubstituted alkyl.

In any of the above embodiment of the composition the high carbon polymer substituents, $R_1$ and $R_2$, may be independently selected from an unsubstituted alkyl or a substituted alkyl. In a more specific embodiment of this aspect of the invention $R_1$ and $R_2$ may be independently selected from a $C_1$ to $C_4$ unsubstituted alkyl or a $C_1$ to $C_4$ substituted alkyl. In yet another more specific embodiment $R_1$ and $R_2$ may be a methyl group.

In the above embodiments where either $R_1$ or $R_2$ is a substituted alkyl, the substituents may be independently selected from group consisting of unsubstituted alkyl, substituted alkyl, unsubstituted aryl, substituted aryl, alkylaryl, haloalkyl, halide, hydroxyl, amino and amino alkyl and mixtures thereof. In another embodiment of this aspect of the invention the substituents may be selected from an unsubstituted alkyl.

In any of the above embodiment of the composition the high carbon polymer may have $R_1$ and $R_2$ may be hydrogen.

The in the above novel composition the high carbon polymer may be obtained by a condensation reaction of a monomer (I) comprising a fused aromatic ring with a methylene group, a monomer (II) comprising a phenyl moiety with 2 attached vinyl groups and a monomer (III) with a hydroxybiphenyl moiety, in the presence of an acid catalyst. The reaction may further comprise a fused aromatic compound (IV). As an example, the monomer (II) may be divinylbenzene; the compound (I) may be anthracene methanol such as 9-anthracene methanol; the compound (III) may be 2-phenylphenol; and, the compound (IV) may be naphthalene, anthracene or pyrene. The compound (I) may also be derived from $ArCH_2X$, where Ar is the fused aromatic moiety, and X is a leaving group, such as OH, Cl, I, Br, carboxylate, sulfonate, etc; examples of compound (I) are anthracenemethanol, phenanthrenemethanol, pyrenemethanol, fluoranthenemethanol, coronenemethanol, triphenylenemethanol, anthracene-9-methanol, anthracene methylmethoxy, etc. The fused aromatic rings provides reactive sites which are sites for electrophilic substitution. The biphenyl unit substituted with OH may be chosen from compounds (III) such as 2-phenylphenol, 3-phenylphenol, 4-phenylphenol, 2-(3-hydroxyphenyl)phenol, 2-(2-hydroxyphenyl)phenol and the like such that at least two sites are available for electrophilic attack.

The fused aromatic moiety, Ar', in the high carbon polymer comprises fused aromatic rings, which are substituted or unsubstituted, but different from unit A. The fused aromatic rings of the polymer can comprise 2 to 8 membered aromatic rings. Examples of the fused aromatic moiety which are possible candidates for both Ar' and Ar are the following structures 6-17. For Ar in structure (3) when $X_1$ is a direct valence group structures 6-17 correspond to possible repeat units in the polymer. In structures 6-17 the position bonds to the aromatic rings may be to any ring of these structures as long as proper carbon valence is maintained. For Ar in structure (3) when $X_1$ is an alkylene spacer would have as one the two connections to the polymer backbone a connection through an alkylene moiety $X_1$ present as shown as shown in structures 6a-17a. Here again, these Structures encompass the possibility that connections to the fused aromatic ring may be through any of the rings, as long as proper carbon valence is maintained. A non-limiting example of an $X_1$ alkylene moiety would be one chosen from methylene, ethylene, propylene, butylene and the like. In a more specific non-limiting example, the spacer can be a methylene moiety. Although structures 6 to 14 are shown with only two bonds linking for Ar (when $X_1$ is a direct valence bond) and Ar' it is envisaged that these fused ring groups may form more than two direct valence bonds with the polymer backbone (e.g. 3); for instance, three bonds could be present forming a branching point in the polymer chain. Similarly for Ar, when $X_1$ is an alkylene moiety in structure (3), although there is only one link with the alkylene moiety to the polymer backbone, this moiety may be linked through more than one direct valence bond to the polymer backbone (e.g. 2), forming, again, a branching point in the polymer backbone.

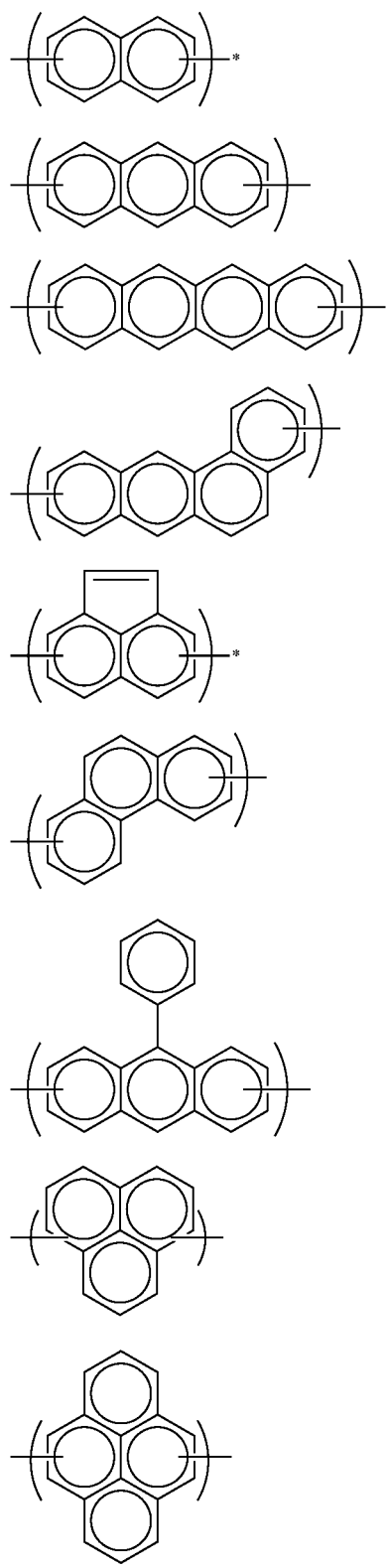

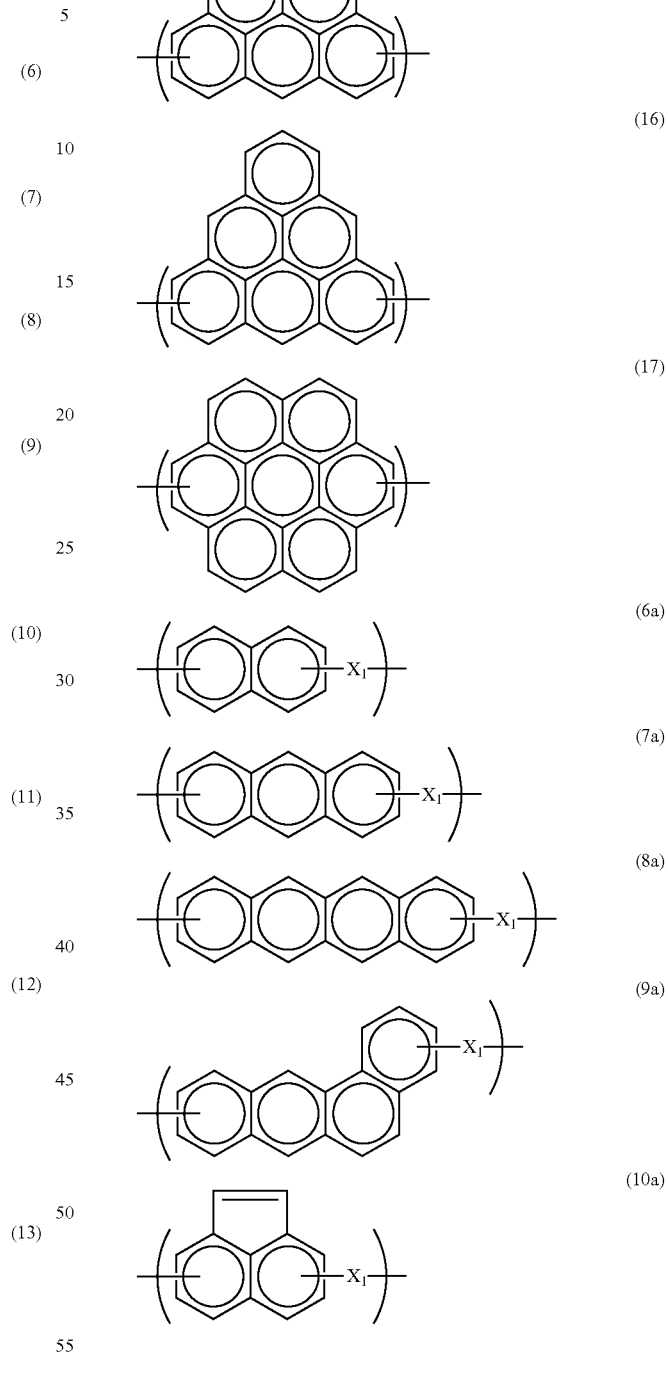

Although the unit may be as shown in structures 6-17, the fused rings Ar and/or Ar may form the backbone of the high carbon polymer at any site in the aromatic structure and the attachment sites may vary within the polymer. The fused ring structure can have more than 2 points of attachment forming a branched oligomer or branched polymer. In one embodiment of the polymer, the fused aromatic unit is connected to another aromatic carbon moiety or another fused aromatic unit. Blocks of fused aromatic units may be formed and the blocks may be separated by a saturated aliphatic carbon unit, such as methylene.

The fused aromatic rings of the polymer Ar or Ar' may be unsubstituted or substituted with one or more organo constituents, such as alkyl, substituted alkyl, aryl, substituted aryl, alkylaryl, and haloalkyls, hydroxyl, amino, aminoalkyl, alkoxy, such as methyl, aminomethyl, bromomethyl, and chloromethyl group. Up to 4 substituents may be present. In addition, to these substituent, a hydrocarbon alkylene or alkenylene moiety (a.k.a saturated or unsaturated hydrocarbon spacer having 3 to 8 carbons) may form a ring attached at the ring at two adjacent carbons of the fused aromatic ring to form a 5 to 10 ring cycle with the fused ring.

The substituents on the aromatic rings may aid in the solubility of the polymer in the coating solvent. Some of the substituents on the fused aromatic structure may also be thermolysed during curing, such that they may not remain in the cured coating and thus give a high carbon content film useful during the etching process.

The high carbon polymer may comprise more than one type of the fused aromatic structures described herein. In one embodiment the fused aromatic moiety is unsubstituted. In one embodiment the fused aromatic moiety is free of hydroxy or alkoxy groups. In another embodiment the fused aromatic moiety of A and the phenyl group of B is unsubstituted, that is substituted only with hydrogen. In another embodiment A is anthracenemethylene, B is methylenebenzenemethylene and C is hydroxybiphenyl; D when present is naphthalene or anthracene.

The high carbon polymer of the present novel composition may be synthesized by reacting a) at least one aromatic compound comprising 2 or more fused aromatic rings capable of electrophilic substitution such that the fused rings form the backbone of the polymer, with b) at least one aromatic unit with two active sites which can form carbocations, and c) at least one hydroxybiphenyl compound, in the presence of an acid catalyst. The aromatic compound may be selected from monomers that provide the desired aromatic unit, more specifically structures shown above or equivalents. Additional fused aromatic monomers may be added to the reactions mixture and may be selected from compounds such as anthracene, phenanthrene, pyrene, fluoranthene, coronene triphenylene, etc. The fused aromatic rings provide at least 2 reactive sites which are sites for electrophilic substitution.

The high carbon polymer may comprise the following units,

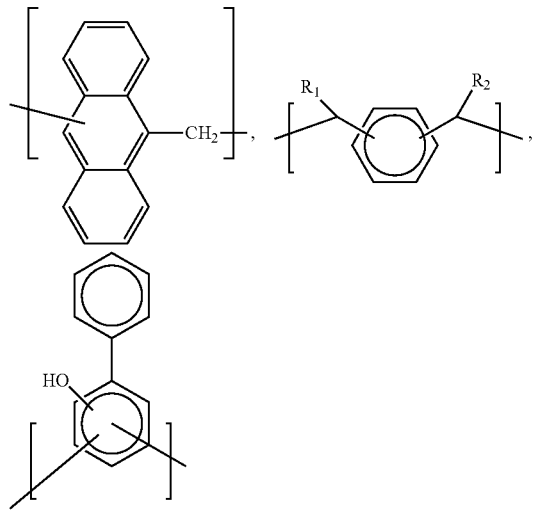

where $R_1$ is $C_1$-$C_4$ alkyl and $R_2$ is $C_1$-$C_4$ alkyl. In one embodiment $R_1$ and $R_2$ are hydrogen or methyl. In addition to the fused ring unit, the high carbon polymer of the novel hard mask coating composition coating further comprises at least one unit, B, shown in structure (2) which comprises a phenyl group. The unit B may be derived from a monomer comprising 2 unsaturated groups, such as alkyl substituted or unsubstituted divinyl benzene. The polymer comprise units, -(A)-, -(B)- and -(C)-, where A is any fused aromatic moiety described previously, which may be linear or branched, substituted or unsubstituted, where B is phenyl group which is connected to A through a saturated carbon, as shown in structure 2, and C is the hydroxybiphenyl unit. The polymer of the present novel composition may be synthesized by reacting a) at least one aromatic compound comprising 2 or more fused aromatic rings capable of electrophilic substitution such that the fused rings form the backbone of the polymer, with b) at least one aromatic unit with two active sites which can form carbocations, and c) at least one hydroxybiphenyl compound, in the presence of an acid catalyst. The aromatic compound may be selected from monomers that provide the desired aromatic unit, more specifically structures shown above or equivalents. Additional fused aromatic monomers may be added to the reactions mixture and may be selected from compounds such as anthracene, phenanthrene, pyrene, fluoranthene, coronene triphenylene, etc. The fused aromatic rings provide at least 2 reactive sites which are sites for electrophilic substitution.

The monomer used to form unit B in the high carbon polymer component of the novel composition comprises a phenyl unit with two reactive sites which are capable of forming carbocations in the presence of an acid, and may be selected from compounds such as divinyl benzene. The reaction is catalyzed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong nonnucleophilic acids. The reaction may be carried out with or without a solvent. If a solvent is used then any solvent capable of dissolving the solid components may be used, especially one which is nonreactive towards strong acids. Examples of such are solvents such as chloroform, bis(2-methoxyethyl ether), nitrobenzene, methylene chloride, and triglyme, di(ethyleneglycol)dimethylether, di(propyleneglycol)dimethylether, di(propyleneglycol)diethyl ether, propylene glycol monomethy ether acetate (PGMEA), propylene glycol monomethyl ether (PGME) may be used. The reaction may be mixed for a suitable length of time at a suitable temperature, till the polymer is formed. The reaction time may range from about 3 hours to about 24 hours, and the reaction temperature may range from about 80° C. to about 180° C. The polymer is isolated and purified in appropriate solvents, such as methanol, hexane, heptane through precipitation and washing. The high carbon polymer component of the novel composition may be fractionated to obtain a fraction with the desired molecular weight. The polymer is dissolved in a solvent, for example tetrahydrofuran (THF); a non-solvent is added to the solution such as an alkane; and a precipitate is formed and filtered. The process of fractionation may be carried out at room temperature. The polymer may be further purified. Typically the low molecular weight portion is removed. Previously known techniques of reacting, isolating and purifying the polymer may be used. The weight average molecular weight of the polymer can range from about 1200 to about 5,000, or about 1300 to about 3,000 or about 1,500 to about 2,600.

In one embodiment, the fused aromatic moiety of structure (3) comprises a fused aromatic ring which has 3 or more fused rings and also has $X_1$ which is an alkylene moiety. Although not bound by theory, it is believed that such moieties have a better crosslinking capability in the inventive composition which also comprises a metal oxide nanoparticle, fused rings moieties having only 2 fused aromatic rings. Scheme 1 Shows a non-limiting example of a synthesis pathway for a high carbon polymer of this type wherein A is derived from 9-Anthracene Methanol, B is derived from) 2-phenylphenol and C is derived from divinylbenzene and these are reacted together in a solvent with a strong acid such as triflic acid to form a condensation polymer as depicted.

nanoparticles of this inventive composition. A non-limiting Example of the synthesis of this type of high carbon polymer is shown in Scheme 2.

Although not bound by theory it is believed that the type of polymers by Scheme 2 where the ring fused ring in the fused ring moiety contains 3 or more fused aromatic ring unexpectedly allows these polymers to be oxidized at relatively low bake temperatures, thus further reducing hydrogen content and both boosting metal content and the etch resistance of the composition. This approach also provides for more reactive sites for the metal oxide nanoparticle to react with these polymers and allows for still better crosslinking and less tendency for patterns etched into this material to undergo swelling (pattern distortion) in plasmas containing fluorinated compound (e.g. $CF_4$, HF and the like). Although, not being bound by theory, the distortion may be due to the replacement of smaller atoms of hydrogen with larger atoms of fluorine and the better crosslinking

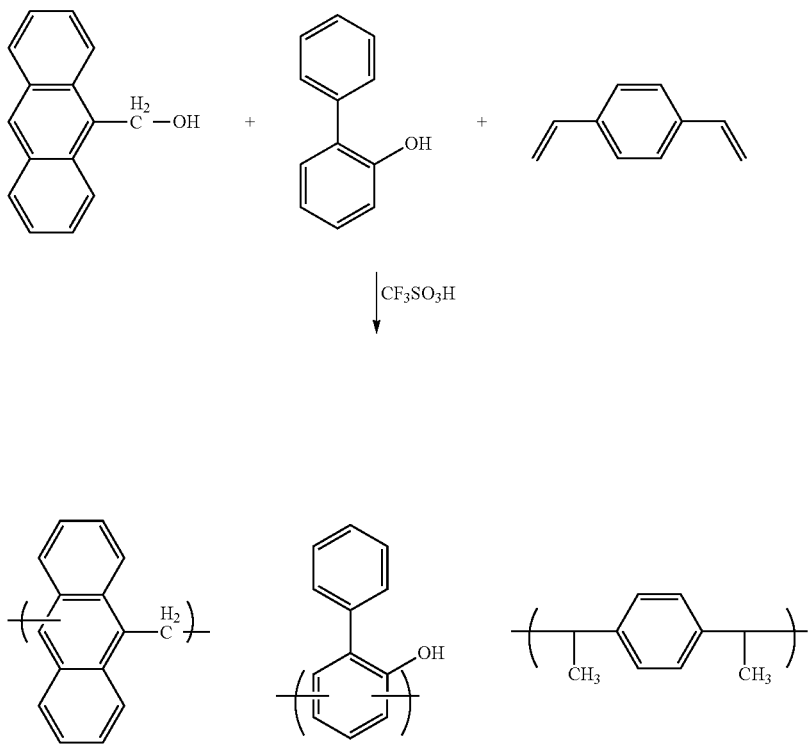

In another embodiment, fused aromatic moieties of structure (3) with 3 or more fused aromatic rings such as pyrene and also have $X_1$ as a direct valence bound are also believed to have better crosslinking ability with the metal oxide ability of such moieties with the metal oxide nanoparticle component. Scheme 2 below shows the formation of a high carbon polymer of this embodiment employing the high carbon, low hydrogen monomer pyrene.

Scheme 2

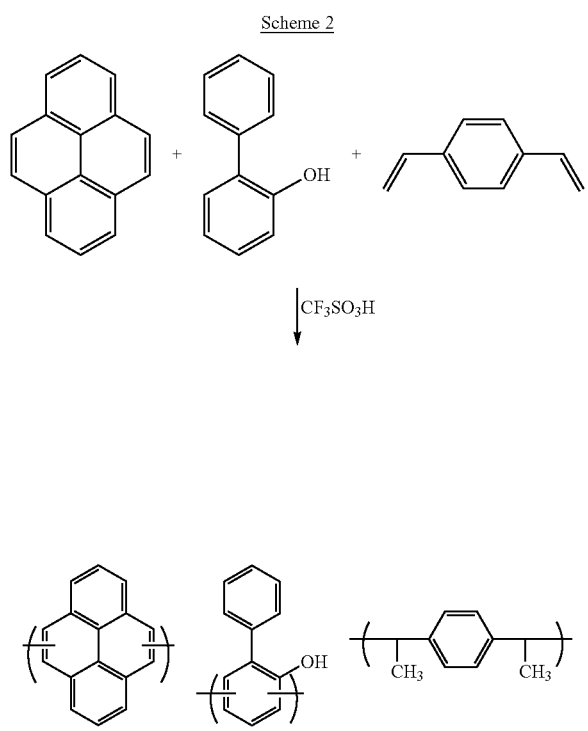

Further examples of the synthesis of these types of high carbon polymers may be seen in US application US-2015-2511943 and U.S. Pat. No. 8,906,590 which are hereby Incorporate by reference into this application.

In one embodiment the high carbon polymer component of the novel composition is free of any aliphatic cyclic or polycyclic groups, such as cyclohexyl, adamantyl, norbornyl, etc.

In another embodiment the high carbon polymer component of the novel composition is free of any aliphatic cyclic or polycyclic groups, hydroxy or alkoxy group other than the one present in unit C. In one embodiment no polymer in the composition comprises an aliphatic polycyclic group, such as cyclohexyl, adamantyl, norbornyl, etc.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkyloxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like. Alkyloxy means straight or branched chain alkyloxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy. Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

In one embodiment the high carbon polymer component of the novel composition is free of any aliphatic cyclic or polycyclic groups, such as cyclohexyl, adamantyl, norbornyl, etc.

In another embodiment the high carbon polymer of the novel composition is free of any aliphatic cyclic or polycyclic groups, hydroxy or alkoxy group other than the one present in unit C. In one embodiment no polymer in the composition comprises an aliphatic polycyclic group, such as cyclohexyl, adamantyl, norbornyl, etc.

In the high carbon polymer component of the novel composition the repeat unit A (structure 3) derived from a fused aromatic ring can be from about 25 to about 40 mole %, repeat unit B (structure 1) can be from about 37.5 to about 30 mole % and repeat unit C (structure 2) can be from about 37.5 to about 30 mole %. In another embodiment repeat unit A containing a fused aromatic ring can be from about 30 to about 35 mole %, repeat unit B can be from about 32.5 to about 35 mole %, and repeat unit C can be from 32.5 35 mole % of the total amount of repeat units. When combining the above ranges the sum of mole % equals 100 mole % and cannot exceed 100 mole %.

In the high carbon polymer component of the novel composition the repeat unit A derived from a fused aromatic ring can be from about 25 to about 40 mole %, repeat unit B can be from about 37.5 to about 30 mole % and repeat unit C can be from about 37.5 to about 30 mole %. In another embodiment repeat unit A containing a fused aromatic ring can be from about 30 to about 35 mole %, repeat unit B can be from about 32.5 to about 35 mole %, and repeat unit C (structure 2) can be from 32.5 35 mole % of the total amount of repeat units. When combining the above ranges the sum of mole % equals 100 mole % and cannot exceed 100 mole %.

The high carbon polymer of the present novel composition may have the structural unit as shown in structure (18), where $R_1$ and $R_2$ are as previously described. In such a polymer the total amount of the repeat unit A and D derived from a fused aromatic ring be from about 25 to about 40 mole % of this total, monomer D can comprise up to 15% of the total amount. Of the remaining units repeat unit A may be from about 37.5 to 30 mole % and repeat unit should be from about 37.6 to about 30 mole % of the total amount of repeat units. More preferably repeat unit B and D containing a fused aromatic ring be from about 30 to about 35 mole % of this total, monomer D can comprise up to 15% of the total amount. Repeat unit A should be from about 32.5 to about 35%, and repeat unit C from about 32.5 to about 35% of the total amount of repeat units. In all the above mole % ranges when combining the % mole % quantities given for the possible range of A, B, C or D the sum of the mole % for a polymer containing repeat units A B and C or a polymer containing A B C and D adds to 100 mole % and cannot exceed 100 mole %.

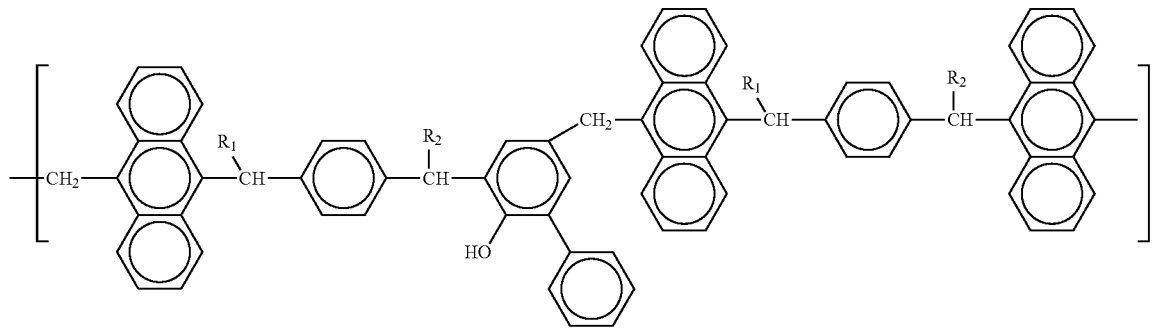

(18)

The carbon content of the composition or high carbon polymer can be measured after forming a coating on a substrate and using the polymer by itself dissolved in the solvent component without the nanoparticle component and drying the resultant film. The polymer of the present invention retains a high carbon content even after a 400° C. bake, for about 120 minutes, that is the carbon content of the polymer or composition after crosslinking is greater than 80 wt. % as measured by elemental analysis, or greater than 85 wt. %, or greater than 90 wt. %. These wt. % values may be estimated by performing an elemental analysis on the solid coating or dry polymer provides the carbon content as wt. %. The carbon content of the polymer or composition after baking at 400° C. is greater than 80 wt. % as measured by elemental analysis, or greater than 85 wt. %, or greater than wt 90%. In one embodiment the carbon content of the polymer after baking at 400° C. for 120 min is in the range 80-95 wt. %.

The above described high carbon polymers are soluble in the solvent and in a mixture with the solvent as described below and form uniform dispersions in these solvent(s) with the metal oxide nanoparticles.

More than one type of the above described high carbon polymer may be employed in the novel composition (i.e. 2 or more), where the additional polymer(s) differs either in the relative composition of the units of structure (1), (2), (3) and/or an optional additional type of repeat unit such as one having structure (5) or where these any of each type of repeating unit structure differs chemically from that present in the first polymer containing these units. Blends of such polylmers having different molecular weights, polydispersities are also anticipated.

In another embodiment of any of the possible high polymers described herein the polymer(s) comprised of repeat units having structure (1), (2) and (3) are free of any aliphatic cyclic polycyclics.

The metal oxide nanoparticles of the above described novel composition are selected from the group consisting of Zirconium oxide nanoparticles, Hafnium oxide nanoparticles, Aluminum oxide nanoparticles, Tungsten nanoparticles, Titanium oxide nanoparticles, Copper oxide nanoparticles, Cuprous oxide nanoparticles, Tin oxide nanoparticles, Cerium oxide nanoparticles, Indium Tin oxide nanoparticles, Zinc oxide nanoparticles, Yttrium oxide nanoparticles, Lanthanum oxide nanoparticles and Indium oxide nanoparticles.

In another aspect of this invention the novel composition is one in which the metal oxide nanoparticles are selected from the group consisting of Zirconium oxide nanoparticles, Hafnium oxide nanoparticles, Aluminum oxide nanoparticles, Tungsten nanoparticles, and Titanium oxide nanoparticles.

In another aspect of this invention the novel composition is one in which the metal oxide nanoparticles are Zirconium oxide nanoparticles.

In another aspect of this invention the novel composition is one in which the metal oxide nanoparticles are Hafnium oxide nanoparticles.

In another aspect of this invention the novel composition is one in which the metal oxide nanoparticles are Titanium oxide nanoparticles.

In another aspect of this invention the novel composition is one in which the metal oxide nanoparticles are a mixture of two or more different types of metal oxide nanoparticles as described above.

In all the above aspect of the above described novel compositions said metal oxide nanoparticles may be selected from ones that range in diameter size from about 1 nm to about 100 nm. In another embodiment of this aspect of the invention said metal oxide nanoparticles may be selected from ones that range in diameter size from about 0.5 nm to about 100 nm. In a further aspect of the above embodiment, said metal oxide nanoparticles may be selected from ones that range in diameter size from about 1 nm to about 5 nm.

In another aspect of this invention the novel composition is one in which the metal oxide nanoparticles may be selected from ones that range in diameter size from about 1 nm to about 10 nm.

In another aspect of this invention the novel composition is one in which the metal oxide nanoparticles may be selected from ones that range in diameter size from about 1 nm to about 20 nm.

In another aspect of this invention the novel composition is one in which the metal oxide nanoparticles may be selected from ones that range in diameter size from about 1 nm to about 30 nm.

In another aspect of this invention the novel composition is one in which the metal oxide nanoparticles may be selected from ones that range in diameter size from about 1 nm to about 40 nm.

In another aspect of this invention the novel composition is one in which the metal oxide nanoparticles may be selected from ones that range in diameter size from about 0.5 nm to about 5 nm.

In another aspect of this invention the novel composition is one in which the metal oxide nanoparticles may be selected from ones that range in diameter size from about 0.5 nm to about 10 nm.

In another aspect of this invention the novel composition is one in which the the metal oxide nanoparticles may be selected from ones that range in diameter size from about 5 nm to about 10 nm.

In another aspect of this invention the novel composition is one in which the metal oxide nanoparticles may be selected from ones that range in diameter size from about 5 nm to about 9 nm.

In another aspect of this invention the novel composition is one in which the metal oxide nanoparticles may be selected from ones that range in diameter size from about 6 nm to about 9 nm.

In all the above aspect of the novel composition said metal oxide nanoparticles are dispersed in said composition at a loading ranging from about 1 wt. % to about 80 wt. %.

In another aspect of this invention the composition is one in which has been prepared by using a mixing a suspension of metal oxide nanoparticles dispersed in a first organic solvent and combining this with the solid high carbon polymer, a second organic solvent and other optional components, or combining this dispersion of nanoparticles with a solution comprised of the polymer and other optional components in a second organic solvent.

The second organic solvent and the first organic solvent may be different or the same and are and may be chosen from a single organic solvent or a mixture of two or more organic solvent chosen from the same category or from different categories as follows:
hydroxyalkyleneoxyalkyls (HO-alkylene-O-alkyl), hydroxyalkylenecarbonyloxyalkyls (HO-alkylene-$CO_2$-alkyl), alkyloxyalkyleneoxyalkyls (alkyl-O-alkylene-O-alkyl), alkyloxyalkylenecarbonyloxyalkyl (alkyl-O-alkylene-$CO_2$-alkyl alkyloxyalkyleneoxycarbonylalkyls (alkyl-O-alkylene-O—CO-alkyl), Cyclic alkyleneoxycarbonyloxy (cyclic (-alkylene-O—$CO_2$—) (a.k.a lactones) alkyl esters of alkyl carboxylic acids or formic acid (alkyl-O—CO-alkyl(or —H), alkyl carbonates (alkyl-O—CO2-alkyl), cyclic alkylene carbonates (cyclic (-alkylene-$OCO_2$—), alkyl ethers (alkyl-O-alkyl) alkyl ethers, ketones (alkyl-CO-alkyl and cyclic (-alkylene-CO—), alkyl alcohols, Alkyl amides (alkyl-CONH-alkyl); dialkyl amides (alkyl-CO(alkyl)-alkyl), cyclic alkylene amides (cyclic-(-alkylene-NH—)(a.k.a. lactams) cyclic N-alkyl alkylene amides (cyclic-(-alkylene-N(alkyl)-)) (a.k.a. N-alkyl lactams), organic aromatic solvents and mixtures hereof.

The second organic solvent and the first organic solvent may be different or the same and are and may be chosen from a single organic solvent or a mixture of two or more specific organic solvents may be chosen as follows:

Non-limiting examples of hydroxyalkyleneoxyalkyls are propylene glycol methyl ether (PGME; 1-Methoxy-2-propanol); propylene glycol ethyl ether, ethylene glycol methyl ether, ethylene glycol ethyl ether, butylene glycol methyl ether and the like.

Non-limiting examples of hydroxyalkylenecarbonyloxyalkyls are propylene glycol acetate, propylene glycol formate, propylene glycol propionate, ethylene glycol acetate, ethylene glycol propionate, ethyl lactate and the like.

Non-limiting examples of alkyloxyalkyleneoxyalkyls are dimethyl ether of propylene glycol, diethyl ether of propylene glycol Non-limiting examples of alkyloxyalkylenecarbonyloxyalkyl are propylene glycol methyl ether acetate (PGMEA, a.k.a. 1-methoxy-2-propanol acetate), propylene glycol ethyl ether acetate, ethylene glycol methyl ether acetate and the like.

Non-limiting examples of alkyloxyalkyleneoxycarbonyoxylalkyls are methyl carbonate of propylene glycol methyl ether, ethyl carbonate of propylene glycol methyl ether and the like.

Non-limiting examples of cyclic alkyleneoxycarbonyloxy are γ-butyrolactone, and δ-valerolactone and the like.

Non limiting examples of alkyl esters of alkyl carboxylic acids or formic acid are n-butyl acetate, n-butyl formate, n-propyl acetate, n-pentyl acetate, amyl acetate and the like.

Non limiting examples of alkyl carbonates are dimethyl carbonate, diethyl carbonate, ethyl methyl carbonate and the like.

Non limiting examples of cyclic alkylene carbonates are propylene carbonate (a.k.a 4-Methyl-1,3-dioxolan-2-one), ethylene carbonate, and the like.

Non limiting examples of alkyl ethers are di-n-propyl ether, di-n-butyl ether, methyl t-butyl ether, dipentyl ether and the like.

Non limiting examples of ketones are methyl ethyl ketone (MEK, a.k.a butanone), cyclohexanone, cyclopentanone and the like.

Non limiting examples of alkyl alcohols are isopropyl alcohol (IPA), n-butanol, n-pentanol, 2-Methyl-1-butanol, 3-Methyl-2-butanol and the like.

Non limiting examples of alkyl amides are methyl acetamide, methyl propamide and the like.

Non limiting examples of dialkyl amides are dimethyl acetamide, diethylacetamide, dimethyl propamide and the like.

Non limiting examples of cyclic alkylene amides are β-propiolactam, γ-butyrolactam, δ-valerolactam, and ε-caprolactam and the like Non limiting examples of (cyclic-(-alkylene-N(alkyl)-)) are N-methyl pyrrolidone, N-ethyl pyrrolidone, N-propyl pyrrolidone, N-butyl pyrrolidone and the like.

More specific examples of solvent which may be employed in the composition either as a solvent (if solvent 1 and 2 are the same) or as solvent 1 and/or solvent 2 (if these are not the same) are as follows:

A glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

More specific examples of solvents which may be employed in the composition either as a solvent (if solvent 1 and 2 are the same) or as solvent 1 and/or solvent 2 (if these are not the same) are as follows:

Propylene glycol methyl ether acetate, propylene glycol methyl ether acetate, propylene glycol methyl ether, cyclohexanone, ethyl lactate and mixtures thereof.

In one embodiment of the novel composition the metal oxide nanoparticles described above are dispersed in a first solvent to be mixed in the other component of the novel composition dissolved in a second solvent which may be the same or a different solvent as described above. In one aspect of this embodiment the concentration of the metal oxide nanoparticles in said first solvent ranges from about 2 wt. % to about 60 wt. %. In another embodiment of this aspect of this invention the composition is one in which said metal oxide nanoparticles in the said composition are dispersed at a loading ranging from about 5 wt. % to about 55 wt. %. In another embodiment of this aspect of this invention the composition is one in which said metal oxide nanoparticles in the said composition are dispersed at a loading ranging from about 10 wt. % to about 55 wt. %. In another embodiment of this aspect of this invention the composition is one in which said metal oxide nanoparticles in the said composition are dispersed at a loading ranging from about 20 wt. % to about 55 wt. %. In another embodiment of this aspect of this invention the composition is one in which said metal oxide nanoparticles in the said composition are dispersed at a loading ranging from about 30 wt. % to about 55 wt. %. In another embodiment of this aspect of this invention the composition is one in which said metal oxide nanoparticles in the said composition are dispersed at a loading ranging from about 40 wt. % to about 55 wt. %. In another embodiment of this aspect of this invention the composition is one in which said metal oxide nanoparticles in the said composition are dispersed at a loading ranging from about 45 wt. % to about 55 wt. %.

In another embodiment of this aspect of this invention, the composition is one in which said metal oxide nanoparticles in the said composition are dispersed at a loading ranging from about 45 wt. % to about 50 wt. %.

In one embodiment of the inventive composition of the present invention it may contain about 5 wt. % to about 20 wt. % metal oxide nanoparticle component. In another aspect of this embodiment it may contain about 6 wt. % to about 18 wt. % metal oxide nanoparticle component. In yet another embodiment of this embodiment it may contain about 6 wt. % to about 16 wt. % metal oxide nanoparticle component. In yet another aspect of this embodiment it may contain about 6 wt. % to about 15 wt. % metal oxide nanoparticle component. In still another embodiment it may contain about 7 wt. % to about 15 wt. % metal oxide nanoparticle component. In still another embodiment it may contain about 7 wt. % to about 14 wt. % metal oxide nanoparticle component. In all the above embodiments the combination of solvent, high carbon polymer component(s), optional additives and metal nanoparticles may not exceed 100 wt. %. Moreover, in the above embodiments it is envisaged that more than one type of nanoparticle may be present (i.e 2 or more) in the composition in which case the above described wt. % composition of nanoparticles represents the total wt. % of all the different types of nanoparticles present.

In one embodiment of the inventive composition of the present invention it may contain about 1 wt. % to about 20 wt. % of the high carbon polymer component. In another aspect of this embodiment the high carbon polymer it may contain about 2 wt. % to about 15 wt. % of the high carbon polymer component. In still another aspect of this embodiment it may contain about 4 wt. % to about 12 wt. % of the high carbon polymer component. In yet another aspect of this embodiment it may contain about 6 wt. % to about 12 wt. % of the high carbon polymer component. In all the above embodiments the combination of solvent, high carbon polymer component(s), optional additives and metal nanoparticles may not exceed 100 wt. %. Moreover, in the above embodiments it is envisaged that more than one type of high carbon polymer comprised of structure (1), (2) and (3) (i.e. repeat units A, B and C) having either different ratios and or different types of specific repeat unit having structure (1) (2) or (3) may be present (i.e 2 or more) in the composition in which case the above described wt. % composition of nanoparticles represents the total wt. % of all the different types of nanoparticles present.

In one embodiment, of the inventive composition, the wt ratio in the composition of the metal nanoparticles component to the high carbon polymer may be from about 50:50 to about 99:1. In one aspect it may be about 60:40. In another aspect it may be about 70:30. In another aspect it may be about 80:20. In another aspect it may be about 90:10. In another aspect from about 10:1 to about 1:2. In another aspect it may from about 10:1 to about 1:1. In another aspect of this embodiment the wt ratio may be from about 8:2 to about 1:2. In still another aspect of this embodiment the wt ratio may be from about 7:3 to about 1:2. In still another aspect of this embodiment the wt ratio may be from about 7:3 to about 1:1. In still another aspect of this embodiment the wt ratio may be about 7:3. In still another aspect of this embodiment the wt ratio may be about 1:1. In all the above embodiments the combination of solvent, high carbon polymer component(s), optional additives and metal nanoparticles may not exceed 100 wt. %. Moreover, in the above embodiments it is envisaged if the if composition contains more than one type of metal oxide nanoparticles and/or more than one type of high carbon polymer component (comprised of structure (1), (2) and (3)) the above ratio ranges pertain to the wt ratio of the total wt of different metal nanoparticles to the total wt of the different described of high carbon polymer comprised of structure (1), (2) and (3) having either different ratios and or different types of specific repeat unit having structure (1) (2) or (3) may be present (i.e. 2 or more) in the composition in which case the above described wt. % composition of nanoparticles represents the total wt. % of all the different types of nanoparticles present.

In one embodiment of the inventive composition the wt. % of the total combined components, other than the solvent (s), in the composition may range from about 5 wt. % to about 30 wt. %. In another aspect of this embodiment the wt. % of components in the solvent may range from about 10 wt. % to about 30 wt. %. In yet another aspect of this embodiment the wt. % of components in the solvent may range from about 12 wt. % to about 25 wt. %. In still another aspect of this embodiment the wt. % of components in the solvent may range from about 15 wt. % to about 20 wt. %.

In one embodiment of the inventive composition the high carbon polymer component ranges from about 6 wt. % to about 12 wt. %, the metal oxide nanoparticle ranges from about 15 wt. % to about 20 wt. %, the wt ratio from about the nanoparticles component and the range may be from about 7:3 to about 1:1 and the wt. % of all components in the solvent ranges from about 15 wt. % to about 20 wt. %.

The novel composition may additionally comprise other additives, such as organic acids, esters, thermal acid generators, photo-acid generators, surfactants, other high carbon content polymers etc. The composition may comprise additional polymers, especially those with high carbon content. The solid optional components of the novel composition are dissolved in an organic coating solvent composition, comprising one or more organic solvents, as described above.

In one embodiment of the novel composition in addition to the metal oxide nanoparticle component, the high carbon polymer component and the solvent it further comprises a surfactant. In one aspect of this embodiment the surfactant is selected from the group consisting of non-ionic surfactants, anionic surfactants and amphoteric surfactants.

In one specific embodiment where the composition contains a surfactant this surfactant is a non-ionic for example a polyoxyethylene alkyl ethers such as polyoxyethylene lauryl ether, polyoxyethylene oleyl ether and polyoxyethylene cetyl ether; polyoxyethylene fatty acid diesters; polyoxy fatty acid monoesters; polyoxyethylene-polyoxypropylene block polymers; acetylene alcohols; acetylene glycols; polyethoxylates of acetylene alcohols; acetylene glycol derivatives such as polyethoxylates of acetylene glycols; fluorine-containing surfactants, such as Fluorad (trade name, manufactured by Sumitomo 3M Ltd.), MEGAFACE (trade name, manufactured by DIC Corporation) such as Megaface: R-2011 (fluorinated polymer), R-40: (Oligomer with fluoro, hydrophilic and lipophilic group, nonionic, liquid), R-41: (Oligomer with fluoro and lipophilic group, nonionic, liquid), R43: (Oligomer with fluoro and lipophilic group, nonionic, liquid) MFS-344: (Oligomer with fluoro and lipophilic group, nonionic, liquid). Other non-ionic surfactants include Surufuron (trade name, manufactured by Asahi Glass Co., Ltd.); and organosiloxane surfactants such as KP341 (trade name, manufactured by Shin-Etsu Chemical Co., Ltd.). Examples of the above-described acetylene glycols include 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol and 2,5-dimethyl-2,5-hexanediol. In one specific embodiment the surfactant is a Fluorosilicon modified nonionic surfactant In one specific embodiment where the composition contains a surfactant where this surfactant is an anionic surfactant, this anionic surfactant is selected from an anionic surfactants; which may be selected from ammonium salts and organic amine salts of alkyldiphenyl ether disulfonic acids; ammonium salts and organic amine salts of alkyldiphenyl ether sulfonic acids; ammonium salts and organic amine salts of alkylbenzenesulfonic acids; ammonium salts and organic amine salts of polyoxyethylene alkyl ether sulfuric acids; and ammonium salts and organic amine salts of alkyl sulfuric acids.

In one specific embodiment where the composition contains a surfactant where this surfactant is an amphoteric surfactant, examples of the amphoteric surfactants include 2-alkyl-N-carboxymethyl-N-hydroxyethyl imidazolium betaine and lauric acid amide propylhydroxysulfone betaine.

In the above embodiments where the novel composition comprises a surfactant, these surfactants may be used individually, or two or more thereof may be used in combination, and the blending ratio thereof is usually 50 to 5,000 ppm, preferably 100 to 2,000 ppm, with respect to the total wt of the composition.

The novel composition of the present invention may further comprise a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple functional groups, are capable of crosslinking with the polymer. Polymeric crosslinkers may be used, such as polymers of glycoluril, melamine, etc., such as those disclosed in U.S. Pat. No. 7,691, 556. Examples of compounds which can be crosslinkers are, 1,3 adamantane diol, 1,3, 5 adamantane triol, polyfunctional reactive benzylic compounds, tetramethoxymethyl-bisphenol (TMOM-BP) of structure (19), aminoplast crosslinkers, glycolurils, Cymels, Powderlinks, etc.

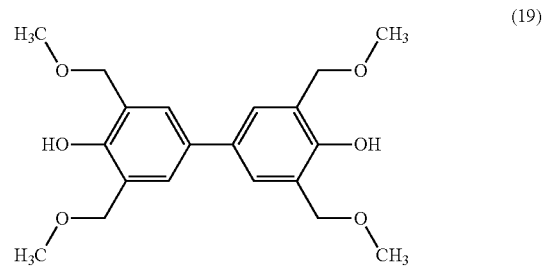

(19)

The novel composition comprising may also comprise an acid generator, and optionally a crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer with itself an optional crosslinker and/or the nanoparticles present in the composition. Particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoro alkylsulfonyl)methide, diaryliodonium bis (fluoro alkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris (fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures from about 170 to about 220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain at least one of the known photoacid generators, examples of which without limitation, are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, trialkylsulfonium salts, and mixtures thereof. These photoacid generators are not necessarily photolysed but are thermally decomposed to form an acid.

The crosslinker, when used in the composition, may be present at about 1 wt. % to about 30 wt. % of total solids. The thermal acid generator, may be incorporated in a range from about 0.1 to about 10 wt. % by total solids of the hard mask coating composition, preferably from 0.3 to 5 wt. % by solids, and more preferably 0.5 to 2.5 wt. % by solids. In all the above embodiments the combination of these optional components with the solvent, metal nanoparticles, high carbon polymer component(s), optional additives and metal nanoparticles may not exceed 100 wt. %.

The novel composition may further comprise a second high carbon polymer. The second high carbon polymer can be one which also has carbon content greater than 75 wt. %, or greater than 80 wt. %. The second polymer may comprise a unit containing a fused aromatic ring, A, as described herein, a phenyl moiety, B, and a third unit selected from a substituted fused aromatic ring with greater than 2 aromatic rings. The third unit may be selected from a fused aromatic substituted with a hydroxy group. The third unit may be selected from hydroxyanthracyl moiety, hydroxyphenyl moiety, hydroxynaphthyl moiety, hydroxy pyrenyl moiety, $C_1$-$C_4$alkoxy anthracyl moiety, $C_1$-$C_4$ alkyl phenyl moiety, $C_1$-$C_4$ alkyl naphthyl moiety, $C_1$-$C_4$ alkyl pyrenyl moiety, etc. The third unit may be selected from hydroxyphenyl, hydroxynaphthyl, hydroxyphenanthryl, hydroxyanthracyl, etc. The third unit may be hydroxynaphthyl group. The second high carbon polymer may be added to the composition ranging from 1 wt. % to 20% by wt of the total polymer concentration in the composition, or 1% to 10% by wt of the total polymer concentration. In one embodiment the second polymer is free of any aliphatic cyclic polycyclic groups. In another embodiment the second polymer is free of any aliphatic cyclic polycyclic groups and the third unit is a hydroxynaphthyl group. In all the above embodiments the combination of these optional components with the solvent, metal nanoparticles, high carbon polymer component(s), optional additives and metal nanoparticles may not exceed 100 wt. %.

In one embodiment the novel composition comprises metal nanoparticles, the high carbon polymer(s) comprising structure (1), (2) and (3), a second different type of high carbon polymer described herein, a crosslinker, a thermal acid generator, optional surfactant and solvent(s). Another embodiment of the novel composition comprises metal nanoparticles, the polymer(s) comprising structure (1), (2) and (3), a crosslinker, a thermal acid generator, optional surfactant and solvent(s).

The novel coating composition is coated on the substrate using techniques well known to those skilled in the art, such as dipping, spin coating or spraying. The film thickness of the hard mask coating composition ranges from about 15 nm to about 400 nm. The coating is further heated on a hot plate or convection oven for a sufficient length of time to remove any residual solvent and induce crosslinking, and thus insolubilizing the hard mask coating composition to prevent intermixing from about the antireflective coating and the layer to be coated above it. In another aspect of this embodiment the coating of the composition may be heated a single temperature which may be from about 150° C. to 400° C. In another aspect of this embodiment the coating of the composition may be heated a single temperature which may be from about 350° C. to 400° C.

In one embodiment of using this composition, the coating may be heated in a single step, multiple steps and also in a single step where the temperature is ramped dynamically ramped from one temperature to another (e.g. 150° C. to 400° C.).

Photoresists may be used to produce topography such as Vias to be filled by the inventive composition. Alternatively, photoresists may so be used to produce topography containing features to be filled such as Vias, by the inventive composition. This is done by using a patterned photoresist as a mask to pattern transfer this topography into a substrate (e.g. Si, $SiO_2$ etc.) such or another layer (e.g. high carbon polymer coating such as spin on carbon (SOC)). This pattern transfer of the resist image is done either using a plasma or chemical etch to produce.

When coating the novel composition on patterned or unpatterned. An edge bead remover may be applied after the coating steps to clean the edges of the substrate using processes well known in the art.

The substrates patterned or unpatterned over which the novel hard mask composition can be coated can be any of those typically used in the semiconductor industry. Suitable substrates include, without limitation, photoresists, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. Nos. 4,491,628 and 5,350,660. On the other hand, photoresists for exposure at 193 nm and 157 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849, 377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance from about the high etch resistance of the first polymer type and the high transparency at 157 nm of the second polymer type. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed with a mask. The exposure may be done using typical exposure equipment. Examples of exposure wavelength sources are 248 nm and 193 nm, although any source may be used. The exposed photoresist is then developed in an aqueous developer to remove the treated photoresist. The developer is preferably an aqueous alkaline solution comprising, for example, tetramethyl ammonium hydroxide (TMAH). Example of a developer is 0.26N aqueous tetramethyl ammonium hydroxide (TMAH) solution. The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Another aspect of this invention resides in the process of using this novel hard mask composition to transfer a pattern into a semiconductor substrate by using a patterned film of the novel hard mask composition as an etch barrier to enable pattern transfer into substrate an image by etching those areas of the pattern no protected with the novel metal hard mask film with a fluorine plasma. This may be done, for instance in by two different processes. One of these is a Tone Reversal process as illustrated in FIG. 1. where the novel composition is selectively placed through series of steps into hollow topography, for example by acting as Via filling materials and then using this filled hollow topographical features as a hard mask where this process. The other manner of using these novel hard mask compositions is a Direct Hard Mask Process, where a patterned film of the novel hard mask composition is made which act as a hard mask. This is done, in a series of steps, by using an overlying photoresist pattern to create the metal hard mask as in shown, for example, in FIG. 2. In this process the final step is again a pattern transfer of the metal hard mask into a semiconductor substrate (e.g. Silicon, Ge, GaAs and the like) using a fluorine plasma or other types of plasmas capable of etching the semiconductor substrate.

In either process, the first two steps are to create a film of the novel hard mask composition on a substrate by coating the novel hard mask material to form a film and baking this film. In the Tone Reversal process, the substrate is a patterned organic polymer, etchable by an oxygen plasma, overlying a semiconductor material, is the substrate. In the Direct Hard Mask approach the substrate is a semiconductor material.

These first two steps are as follows:
a) This is a step which is comprised of coating the novel hard mask composition on a substrate to form a film of this hard mask.
b) This is a step which is comprised of baking the film to remove solvent and/or crosslink the film.

In step a) the coating process for the novel hard mask compositions, this may be done by any process suitable for coating an organic polymer or resin from a solution onto a substrate such as, for instance, those employed for coating photoresists on semiconductor substrates. In on embodiment of this process in the baking step b). the film of the hard mask composition may be baked at a temperature which may be about 100° C. to about 500° C. In another embodiment this temperature may be from about 150° C. to about 400° C. In one aspect of these embodiments this bake may be done in a single step for a time ranging from about 30 seconds to 6 minutes. In another aspects of this baking process the bake may be done from about 1 minute to about 2 minutes. In yet another aspect of this baking process it may be done in about 1 minute.

In a further embodiment the baking step b) it may be done in two baking steps b1) and b2) at a single different temperature. In this embodiment baking step b1) the baking may done at a temperature selected from about 100° C. to about 270° C. or in another embodiment from about 200° C. to about 275° C. and baking step b2) is done at a temperature selection from about 350° C. to about 500° C. In another embodiment step b1) is about 250° C. and step b2) is about 400° C. In one aspect of these embodiment both bakes are done from about 0.5 to about 6 minutes, or from about 1 minute to about 2 minutes or about 1 minute.

In another aspect of the invention, because of the high thermal stability of the novel hard mask composition film, the bake(s) in steps b) (or b1) or b2)) may be done for a much longer time at high temperature, for example from about 1 to about 3 hours without deterioration of the hard mask properties. This high temperature resistance is useful, when long bakes at higher temperature are required because a separate parallel semiconductor process is being done which requires these harsh condition which is occurring prior to the final pattern transfer of the defined regions of the novel hard mask film into the semiconductor substrate (e.g. vapor phase deposition). In this instances, step b1) may be done for about 0.5 to about 2 minutes and baking step b2) is may be done from about 1 to about 3 hours. In another aspect of this, step b1) is done for about 1 and said baking step b2) is done for about 2 hours. In another aspect of this invention baking step b1) is done for about 1 minute. In another aspect of this invention baking step baking step b2) is done for about 2 hours. The temperatures of these bakes are as described above.

Hard Mask Tone Inversion Process Using Blend of Metal Oxide Nanoparticles and High Carbon Polymer In one aspect of the process the novel hard mask coating is used for a Tone Inversion Application. Specifically, this process includes the coating and baking of the novel hard mask as described above but in this instance the substrate is a patterned substrate which comprising topographical features, which can be filled such as Via or Trenches. The bake step b) may be a single bake or a two steps bake b1) and b2), as described above. These said topographical features may be in a pattern in an organic material film such as patterned polymer, a patterned resist or a patterned spin on carbon layer coated on a semiconductor substrate (e.g. Silicon) where the organic film material is etchable by an oxygen plasma. In this instance, during the coating steps a. and b. the coating of hard mask coating is thick enough to overlay said topography (e.g. Vias and/or Trenches) and this process further comprises step c):

c) This step comprises removing the composition (a.k.a. hard mask film) overlaying the top of the patterned substrate with a chemical stripper or with a fluorinated plasma etch. In one embodiment of this process said topographical features such as Vias, are in a patterned spin on carbon layer overlying a silicon substrate. In a further aspect of this process after above step c above the process further comprises the step d):

d) This step comprises removing the patterned organic polymer (e.g. patterned spin on carbon, patterned resist or other patterned organic polymer coating) with an oxygen plasma, thereby forming a negative tone image of the original patterned photoresist which is comprised of the remaining patterned hard mask film.

In a further embodiment of this process after step d) the process further comprises the step of:

e) This step is comprised of using the remaining patterned metal hard mask film as an etch barrier and etching into the semiconductor substrate with a fluorinated plasma. FIG. 1 illustrates the process of tone inversion in the case where the patterned organic coating is a patterned spin on carbon film such patterned films. The preparation of such patterned spin on carbon films, may be done by using standard lithographic processes such as overlaying a spin on carbon film with a photoresist and using the pattern produced in the photoresist, and pattern transferring this into the underlying spin on carbon film using a plasma.

In one aspect of the Tone Inversion Process the said topographical features (e.g. in a patterned spin on carbon) have an aspect ratio of 1:1 to 10:1. In another embodiment of this aspect of the invention the features have an aspect ratio 1:1 to 10:1 and may be selected from ones that range in critical dimension (CD) from about 10 nm to about 100 nm.

Direct Hard Mask Process Based on Coatings which are a Blend of Metal Oxide Nanoparticles and High Carbon Polymer In another inventive process, the Direct Hard Mask Process, the hard mask coating pattern is generated by creating a pattern in a coating film of the novel composition comprised of metal oxide nanoparticles and the high carbon polymer using a conventional photoresist pattern transfer process to create this patterned hard mask and then transferring this hard mask pattern into an underlying semiconductor substrate (e.g. silicon) where the process is comprised of steps a3) to h3) as follows:

a3) This is the step where the novel metal hard mask is coated onto a semiconductor substrate (e.g. Silicon) to form a hard mask film and is done as previously described for step a).

b3) This is the step where the coated hard mask film of the novel hard mask composition is baked. This bake step may be done as a single bake or in two steps, and may be done in the previously described ranges of temperatures and bake time as previously described for b), b1') and b2')

c3) This is a step in which a bottom antireflective coating is coated on top of the hard mask film, the coating of the bottom antireflective coating (BARC) may also require a bake to remove solvent and/or cure the BARC.

d3) This is a step in which a photo resist is coated on top of said BARC overlying the novel hard mask composition film, e3) This is a step comprised of the steps of coating a resist on top of the BARC, optionally baking the resist to remove solvent, exposing the photoresist to radiation to which is it sensitive (e.g. i-line, g-line, broadband UV. 248 nm, 193 nm, or Extreme Ultra violet (EUV), e-beam and the like), developing the resist (e.g. Aqueous tetramethylammonium hydroxide) thereby forming a pattern in the resist overlaying the BARC film.

f3) This is a step comprised of the step of etching through the BARC film overlying the novel hard mask composition film which not protected by the resist pattern down to the hard mask film with a fluorinated plasma. This step leaves areas of bare hard mask film in the areas not protected by overlying resist, and areas where the hard mask film is still protected by a film of BARC and photoresist.

g3) This is a step of etching through the hard mask film not protected by the bottom antireflective coating and photoresist down to the semiconductor substrate (e.g. silicon) with a chlorine plasma or other suitable plasma forming a pattered hard mask film.

h3) This is a step comprised of etching into the areas of uncovered semiconductor (e.g. silicon) with a plasma (e.g. chorine or other suitable plasma) to transferring the original pattern of the resist into the semiconductor substrate by using the patterned metal hard film as an etch mask.

In one aspect of this Direct Hard Mask process the bake b3) may be done in one step and at a single selected temperature from about 100° C. to about 500° C., baking for a time ranging from about 0.5 to about 6 minutes. In another aspect the temperature range may be about 150° C. to about 400° C.

In another aspect of this direct hard mask process in step b3 the film baked film at a single temperature selected from in any of the above ranges is done in two baking steps b1') and b2'). In baking step b1') the baking may be done at a single temperature selected from about 100° C. to about 275° C. or in another embodiment about 200° C. to about 275° C. and baking step b2') may be done at a single select temperature selected from about 350° C. to about 500° C. In still another aspect of this tone invention process said baking step b1) may be about 250° C. and the baking step b2') is about 400° C.

In yet another aspect of the above described tone inversion processes said baking step b1)' is done for about 0.5 to about 2 minutes and said baking step b2') is done for about 1 to about 3 hours. In another aspect of this invention baking step b1') is done for about 1 minute and said baking step b2') is done for about 2 hours. In another aspect of hard mask application process baking step b1') is done for about 1 minute. In another aspect of this direct hard mask process the baking step baking step b2') is done for about 2 hours. In one aspect of hard mask application process the said photoresist pattern are Vias and have an aspect ratio of 1 to 10 and range. In another aspect of this invention they have an aspect ratio of 1 to 10 and may be selected from ones that range in diameter size from about 10 nm to about 100 nm.

Figure 2:
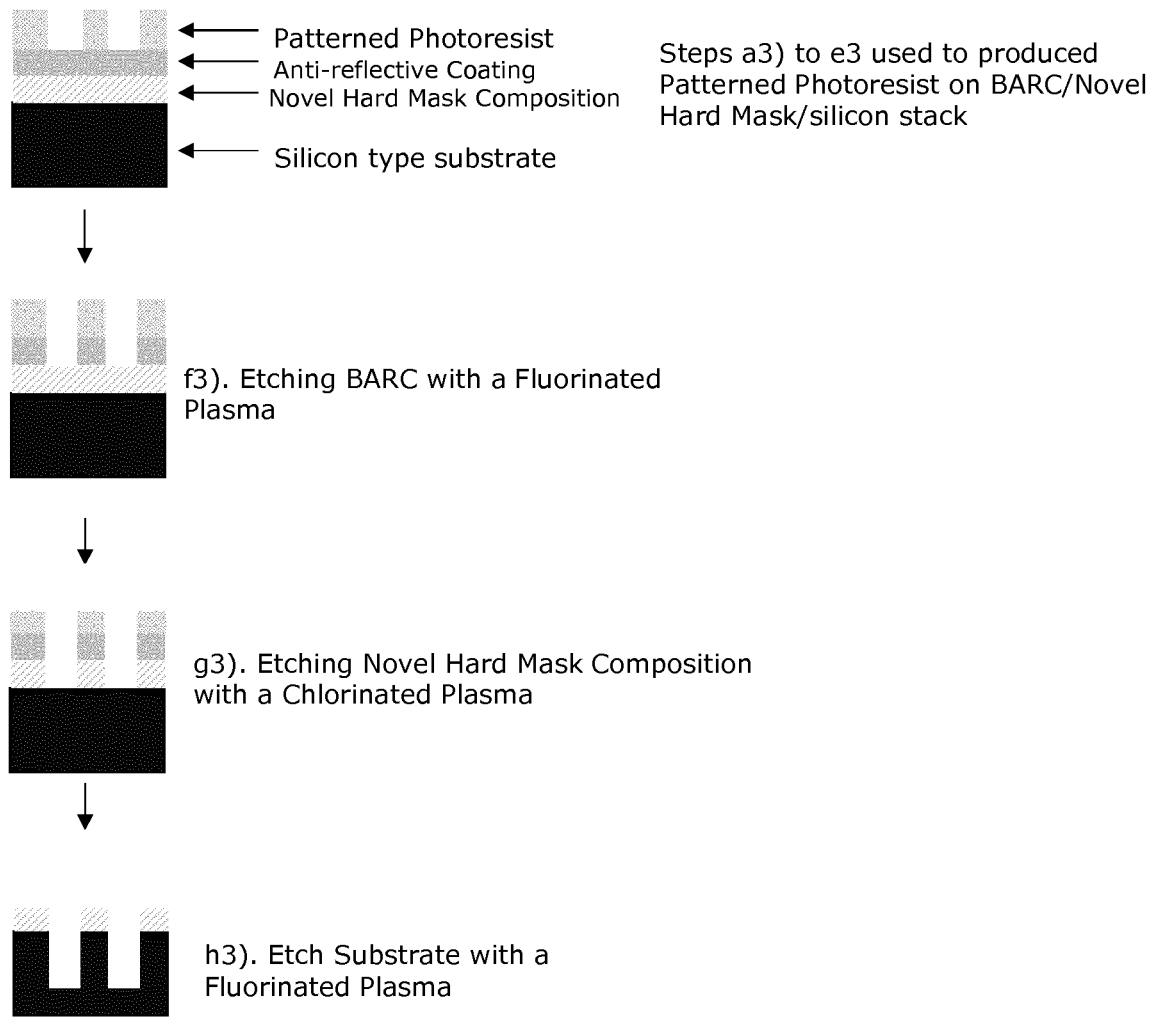
FIG. 2. Direct Hard Mask Process using coating film of metal oxide Nanoparticles and high carbon polymer.
a3) to e3) Steps used to produce initial Patterned Photoresist on BARC/Novel Hard Mask film comprised of metal oxide nanoparticles and high carbon polymer/silicon stack
f3) Step of etching the through the BARC to the Hark mask film with a fluorinate plasma
g3) Step of etching the uncovered Hard mask layer with a chlorine plasma
h3) Step of etching the silicon substrate not protected by the hard mask film.

FIG. 2 illustrates the direct hard mask process using the novel hard mask composition where both a resist and a BARC are employed to form a pattered hard mask on a silicon semiconductor substrate This pattered hard mask is used selectively etch with a fluorine plasma areas of the silicon substrate which are not protected with the hard mask. In FIG. 2 the initial image at the top consisting of a patterned resist over a film of BARC overlying a film of the novel hard composition coated on a silicon substrate was produced by steps a3) to e3) described above. The rest of this FIG. illustrates steps f3) to h3) which are employed to produce the final etched pattern in the silicon substrate as described above.

Direct Hard Mask Process Based on Coatings of Metal Oxide Nanoparticles

In another inventive process, the Direct Hard Mask Process, the novel hard mask coating is generated by creating a pattern in a coating of metal oxide nanoparticles using a conventional photoresist pattern transfer process to create this patterned hard mask and then transferring this hard mask pattern into an underlying semiconductor substrate (e.g. silicon) where the process is comprised of steps a4) to h4) as follows:

a4) This is the step where a composition composed of metal oxide nanoparticles and a spin coating solvent is coated onto a semiconductor substrate (e.g. Silicon) to form a hard mask film and is done as previously described for step a).

b4) This is the step where the coated hard mask film of metal oxide nanoparticles composition is baked. This bake step may be done as a single bake or in two steps, and may be done in the previously described ranges of temperatures and bake time as previously described for b), b1") and b2")

c4) This is a step in which a bottom antireflective coating is coated on top of the metal oxide nanoparticle hard mask film, the coating of the bottom antireflective coating (BARC) may also require a bake to remove solvent and/or cure the BARC.

d4) This is a step in which a photo resist is coated on top of said BARC overlying the metal oxide nanoparticle hard mask film, e4) This is a step comprised of the steps of coating a resist on top of the BARC, optionally baking the resist to remove solvent, exposing the photoresist to radiation to which is it sensitive (e.g. i-line, g-line, broadband UV. 248 nm, 193 nm, or Extreme Ultra violet (EUV), e-beam and the like), developing the resist (e.g. Aqueous tetramethylammonium hydroxide) thereby forming a pattern in the resist overlaying the BARC film.

f4) This is a step comprised of the step of etching through the BARC film overlying the metal oxide nanoparticles film which not protected by the resist pattern down to the hard mask film with a fluorinated plasma. This step leaves areas of bare hard mask film in the areas not protected by overlying resist, and areas where the hard mask film is still protected by a film of BARC and photoresist.

g4) This is a step of etching through the metal oxide nanoparticle hard mask film not protected by the bottom antireflective coating and photoresist down to the semiconductor substrate (e.g. silicon) with a chlorine plasma or other suitable plasma forming a pattered hard mask film.

h4) This is a step comprised of etching into the areas of uncovered semiconductor (e.g. silicon) with a plasma (e.g. chorine or other suitable plasma) to transferring the original pattern of the resist into the semiconductor substrate by using the patterned metal oxide nanoparticle hard mask film as an etch mask.

In one aspect of this Direct Hard Mask process the bake b4) may be done in one step and at a single selected temperature from about 100° C. to about 500° C., baking for a time ranging from about 0.5 to about 6 minutes. In another aspect the temperature range may be about 150° C. to about 400° C.

In another aspect of this direct hard mask process in step b4 the film baked film at a single temperature selected from in any of the above ranges is done in two baking steps b1") and b2"). In baking step b1") the baking may be done at a single temperature selected from about 100° C. to about 275° C. or in another embodiment about 200° C. to about 275° C. and baking step b2") may be done at a single select temperature selected from about 350° C. to about 500° C. In still another aspect of this tone invention process said baking step b1") may be about 250° C. and the baking step b2") is about 400° C.

In yet another aspect of the above described tone inversion processes said baking step b1") is done for about 0.5 to about 2 minutes and said baking step b2") is done for about 1 to about 3 hours. In another aspect of this invention baking step b1") is done for about 1 minute and said baking step b2") is done for about 2 hours. In another aspect of hard mask application process baking step b1") is done for about 1 minute. In another aspect of this direct hard mask process the baking step baking step b2") is done for about 2 hours. In one aspect of hard mask application process the said photoresist pattern are Vias and have an aspect ratio of 1 to 10 and range. In another aspect of this invention they have an aspect ratio of 1 to 10 and may be selected from ones that range in diameter size from about 10 nm to about 100 nm.

In this process the metal oxide nanoparticles are selected from the group consisting of Zirconium oxide nanoparticles, Hafnium oxide nanoparticles, Aluminum oxide nanoparticles, Tungsten nanoparticles, Titanium oxide nanoparticles, Copper oxide nanoparticles, Cuprous oxide nanoparticles, Tin oxide nanoparticles, Cerium oxide nanoparticles, Indium Tin oxide nanoparticles, Zinc oxide nanoparticles, Yttrium oxide nanoparticles, Lanthanum oxide nanoparticles and Indium oxide nanoparticles.

In another embodiment of the above process said metal oxide nanoparticles are selected from the group consisting of Zirconium oxide nanoparticles, Hafnium oxide nanoparticles, Aluminum oxide nanoparticles, Tungsten nanoparticles, and Titanium oxide nanoparticles. In another embodiment said metal oxide nanoparticles are Zirconium oxide nanoparticles. In another embodiment said metal oxide nanoparticles are Hafnium oxide nanoparticles. In another embodiment said metal oxide nanoparticles are Titanium oxide nanoparticles.

In another embodiment of this process said metal oxide nanoparticle are ones which have a diameter from about 1 nm to about 100 nm. In another embodiment of this process the nanoparticles have a diameter from about 5 nm to about 10 nm. In yet another embodiment of this process the nanoparticles have a diameter of about 8.2 nm.

The organic solvent for the nanoparticle coating solution employed in this process may be solvent as previously described to be used with the compositions which were blends of metal oxide nanoparticles and the high carbon polymer. For instance, as non-limiting examples the solvent may be chosen propylene glycol methyl ether acetate, propylene glycol methyl ether, cyclohexanone, ethyl lactate and mixtures of these solvent.

In this novel process the solution of nanoparticles in the organic solvent is one which ranges in composition from about 1 wt. % to about 80 wt. % of metal oxide nanoparticles in the organic solvent. In another aspect of this embodiment the composition is ranges from about 5 wt. % to about 70 wt. %. of metal oxide nanoparticles in the organic solvent. In another embodiment, the composition ranges from about 10 wt. % to about 60 wt. % of metal oxide nanoparticles in the organic solvent. In another embodiment, the composition ranges from about 15 wt. % to about 50 wt. % of metal oxide nanoparticles in the organic solvent. In another embodiment it ranges from about 20 wt. % to about 40 wt. % of metal oxide nanoparticles in the organic solvent. In a final embodiment the composition is one which ranges from about 5 wt. % to 10 about wt. % of metal oxide nanoparticles in the organic solvent.

Figure 3:
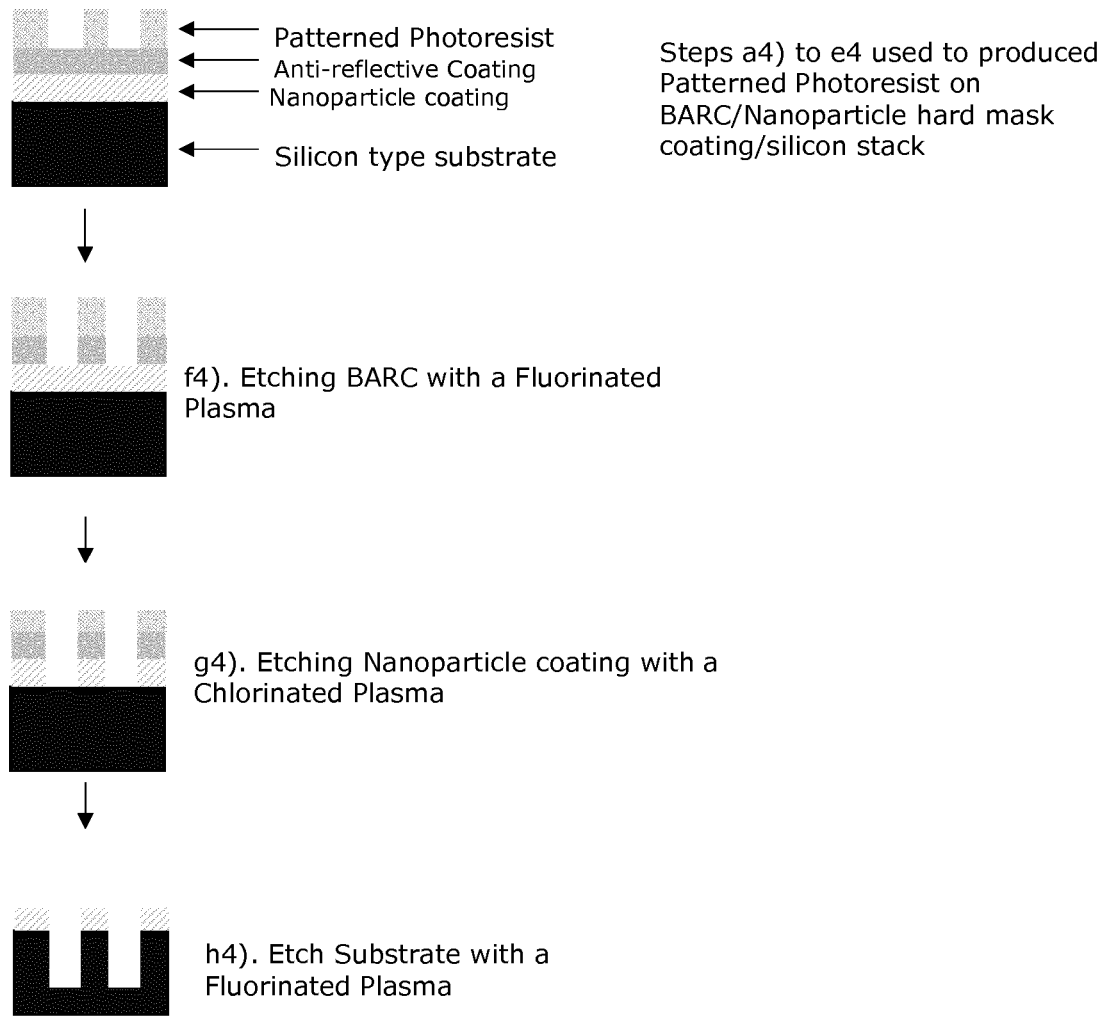
FIG. 3. Direct Hard Mask Process using coating film of metal oxide nanoparticles.
a4) to e4) Steps used to produce initial Patterned Photoresist on BARC/Nanoparticle coating film/silicon stack
f4) Step of etching the through the BARC to the Hark mask film with a fluorinate plasma
g4) Step of etching the uncovered Hard mask layer with a chlorine plasma h4) Step of etching the silicon substrate not protected by the hard mask film

FIG. 3 illustrates the direct hard mask process using a hard mask based on a coating of metal oxide nanoparticles where both a resist and a BARC are employed to form a patterned hard mask on a silicon semiconductor substrate. This pattered hard mask is used selectively etch with a fluorine plasma areas of the silicon substrate which are not protected with the hard mask. In FIG. 3 the initial image at the top consisting of a patterned resist over a film of BARC overlying a film of the novel hard composition coated on a silicon substrate was produced by steps a4) to e4) described above. The rest of this FIG. illustrates steps f4) to h4) which are employed to produce the final etched pattern in the silicon substrate as described above.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The molecular wt of the polymers was measured on a Gel Permeation Chromatograph.

Thermogravimetric Analysis (TGA) was done with a TGA 7 from Perking Elmer (Waltham, Mass., UDS).

Chemicals where obtained as follows:

$ZrO_2$ nanoparticles (8.2 nm) PCPB-2-50-PGA and PCPA-2-50-PGA were obtained from Pixelligent Technologies (Baltimore, Md., 21224, USA. Zirconium oxide propionate was obtained from Gelest Inc. (Morrisville Pa.).

All other chemical were obtained from the Sigma-Aldrich Corp (St. Louis, Mo., USA).

The coated samples of the composition for testing of coatability, skrinkage were done using either a "Clean Track ACT 8," from Tokyo Electron (Tokyo 107-6325, Japan) using 8 inch silicon wafers or a "Clean Track ACT 12," from Tokyo Electron using 12 inch silicon wafers.

Film thickness measurements were done on a "Nanometric Nanospec 9200," from Nanometrics (Milpitas, Calif.).

The Via filling experiments for low bake temperatures were done on an "Optitrac Resist Processing System," Solitec, (Vienna, Austria). The Via filling experiments for 400° C. were done on the "ACT 12," as described above.

Examination of samples for quality of coating or Via filling was done using a "Hitachi 54700 SEM," from Hitachi (Chiyoda, Tokyo, Japan). The SEM images were used to establish that a coating was of uniform film thickness and had a smooth surface. Similarly SEM images were used of Via filled samples to establish that the Via had been properly filled with any defects such as voids etc.

Synthesis Example 1: Copolymer of 2-Phenylphenol Divinylbenzene, and 9-Anthracene Methanol A solution was prepared consisting of 12.76 g (0.075 mole) 2-phenylphenol, 15.62 g (0.075 mole) 9-Anthracene Methanol, 9.76 (0.075 mole) divinylbenzene dissolved in 25 g cyclopepentyl methyl ether (CPME) and 90 g diethylene glycol dimethyl ether (DEGME) and the mixture was stirred for 5 minutes in a 250 mL, 4 neck flask equipped with an overhead mechanical stirrer, condenser, thermo watch, Dean Stark trap and an nitrogen purge. After this time, 1.14 g of triflic acid (3% wt of monomers) was added to the stirred mixture and it was stirred for another 5 minutes. The temperature of the stirred mixture was then raised to 140° C. and heated for 3 hours. After cooling the reaction mixture and diluting it with 250 mL of CPME, it was transferred to a separatory funnel, and it was washed with two aliquots of deionized (DI) water (2×200 mL). The polymer was precipitated by drowning into hexane. The polymer was filtered, washed and dried. The polymer was dissolved in THF and isolated using hexane two additional times to remove all monomer and oligomers. This process yielded 40% finished polymer from the starting materials. The wt average molecular wt of the polymer was 1,859 with a polydispersity of 1.40.

Example 1 Formulation and Coating $ZrO_2$ Nanoparticle Coating $ZrO_2$ nanoparticle dispersion in PGMEA (PCPA) 50 wt. % (10.8 g) was diluted with PGMEA to 9 wt. % solid by adding to it 49.2 g of PGMEA. After sufficient mixing, the solution was spin-coated on the silicon wafer and bake at 250° C. for 60 seconds. The coated wafer shows good coating quality by XSEM picture.

Example 2 Formulation and $ZrO_2$ Nanoparticle Coating

The $ZrO_2$ nanoparticle dispersion in PGMEA (PCPA) 50 wt. % (10.8 g) was diluted with PGMEA to 9 wt. % solid by adding to it 49.2 g of PGMEA. After sufficient mixing, the solution was spin-coated on the silicon wafer and bake at 350° C. for 60 seconds. The coated wafer shows good coating quality by XSEM picture.

Example 3 Formulation and $ZrO_2$ Nanoparticle Coating

The $ZrO_2$ nanoparticle dispersion in PGMEA (PCPA) 50 wt. % (10.8 g) was diluted with PGMEA to 9 wt. % solid by adding to it 49.2 g of PGMEA. After sufficient mixing, the solution was spin-coated on the silicon wafer and bake at 400° C. for 60 seconds. The coated wafer shows good coating quality by XSEM picture.

Example 4 Shrinkage of $ZrO_2$ Nanoparticle Coating

The $ZrO_2$ nanoparticle dispersion in PGMEA (PCPA) 50 wt. % (10.8 g) was diluted with PGMEA to 9 wt. % solid by adding to it 49.2 g of PGMEA. After sufficient mixing, the solution was spin-coated at 1,500 rpm on a silicon wafer and bake at 400° C. for 60 seconds. The coating result is shown in Table 1.

Comparative Example 1: Shrinkage Zirconium Oxide Propionate

Zirconium oxide propionate was place in a reaction vessel and 180 mL of PGMEA was added. After shaking this formulation overnight this solution was filtered through a 0.2 µm filter. This solution was spin-coated at 1,500 rpm on a silicon wafer and baked at 400° C. for 60 seconds. The coating result compared to Example 4 is shown in Table 1.

TABLE 1

| | Shrinkage | | | |
|---|---|---|---|---|
| Example | FT after 350° C./60 sec (Å) | FT after 400° C./90 min (Å) | Film Loss (Å) | % Film Loss |
| Example 4 | 670 | 594 | 76 | 11.34 |
| Comparative example 1 | 626 | 379 | 247 | 39.46 |

Table 1 shows that the Samples of coated with the $ZrO_2$ nanoparticles dispersion gives much less thickness film loss during bake than a solution coated with Zirconium oxide propionate. This is beneficial in hard mask pattern transfer process into a semiconductor such as Si where the hard mask underlies a photoresist and optionally a BARC, where lesser amount of shrinkage will be beneficial as it will reduce any distortion of the patterned hard mask created with the photoresist by reducing any thickness loss associated with the pattern transfer caused by either heating during creation of the hard mask pattern, or heating during other parallel processing which may be occurring elsewhere on semiconductor which in being processed. An example of this hard mask transfer process using a patterned metal oxide nanoparticle hard mask is shown in FIG. 3.

Example 5 Formulation and Coating Evaluation Nanoparticle:Polymer Wt Ratio 7:3

The Synthesis Example 1 polymer (1.5 g) was dissolved in PGMEA (13.5 g) to form a 10 wt. % solution which was mixed with 7 g of the nanoparticle dispersion in PGMEA (PCPA) (50 wt. %) and 5 g of PGMEA. This solution contained 18.52 wt. % total solids of which 12.96 wt. % was from the nanoparticle component and 5.56 wt. % from the high carbon polymer component giving in this solution a wt ratio of nanoparticles to polymer of 70/30. After sufficient mixing, the solution was spin-coated on the silicon wafer and bake at 250° C. for 60 seconds. The coated wafer shows good coating quality by XSEM picture.

Comparative Example 2 Formulation and Via Filling Performance Evaluation

Example 5 was repeated without the additive polymer of Synthesis Example 1 and the Via filling performance evaluation as per Example 6 was repeated with this formulation. XSEM data showed no good filling and a lot of voids present in the Vias.

Example 6 Via Filling Performance Evaluation

The solution of Example 5 with the targeted for a final film thickness of 250 nm was spin-coated on a deep Via substrate at a spin speed of 1500 rpm. The Via wafer used had 650 nm deep Vias with 70, 80, 90, and 100 nm Via size. The Vias were spaced in semi-dense and isolated pattern with respectively hole to space ratios of 1:1, 1:1.4 and 1:6. The coated wafer was subsequently baked at 250° C./60 s. The XSEM data showed excellent film coating quality and good filling performances for both isolated and dense areas without any voids, as shown SEM pictures below.

Example 7 Formulation and Coating

The 1.5 g of Synthesis Example 1 polymer was mixed with 7 g of the nanoparticle dispersion in PGMEA (PCPB) and 16.5 g of PGMEA. This solution contained 20.00 wt. % total solids of which 14.00 wt. % was from the nanoparticle component and 6.00 wt. % was from the high carbon polymer component giving in this solution a wt ratio of nanoparticles to polymer of 70/30. After sufficient mixing, the solution was spin-coated on the silicon wafer and bake at 250° C. for 60 seconds. The coated wafer shows good coating quality by XSEM picture.

Example 8 Via Filling Performance Evaluation

The solution of Formulation Example 7 with the targeted for a final film thickness of 250 nm was spin-coated on a deep Via substrate at a spin speed of 1500 rpm. The Via wafer used had 650 nm deep Vias with 70, 80, 90, and 100 nm Via size. The Vias were spaced in semi-dense and isolated pattern with respectively hole to space ratios of 1:1, 1:1.4 and 1:6. The coated wafer was subsequently baked at 250° C./60 s. The XSEM data showed excellent film coating quality and good filling performances for both isolated and dense areas without any voids, as shown SEM pictures below.

Comparative Example 3 Formulation and Via Filling Performance Evaluation

Formulation 7 was repeated without adding to it the Polymer of Synthesis Example 1, and the coating experiment of example 8 was repeated with this formulation. XSEM data showed no good filling and a lot of voids present in the Vias.

Example 9 Formulation and Coating Nanoparticle:Polymer Wt Ratio 1:1

The Synthesis Example 1 polymer 2.5 g was mixed with 5 g of the nanoparticle dispersion in PGMEA (PCPB) and 16.5 g of PGMEA. This solution (total wt 24 g) contained 20.83 wt. % total solids of which 10.42 wt. % was from the nanoparticle component and 10.42 wt. % was from the Synthesis Example 1 high carbon polymer component giving in this solution, after sufficient mixing, a wt ratio of nanoparticles to polymer of 50:50. 20 g of this solution was further diluted with 6.7 g of PGMEA to give a solution with 15.61 wt. % of which of which 7.80 wt. % was from the nanoparticle component and 7.80 wt. % was from the polymer. After sufficient mixing, the solution was spin-coated on the silicon wafer and bake at 250° C. for 60 seconds. The coated wafer shows good coating quality by XSEM picture.

Example 10 Via Filling Performance Evaluation Nanoparticle:Polymer Wt Ratio 1:1

The solution of Formulation Example 9 with the targeted for a final film thickness of 250 nm was spin-coated on a deep Via substrate at a spin speed of 1500 rpm. The Via wafer used had 650 nm deep Vias with 70, 80, 90, and 100 nm Via size. The Vias were spaced in semi-dense and isolated pattern with respectively hole to space ratios of 1:1, 1:1.4 and 1:6. The coated wafer was subsequently baked at 250° C./60 s. The XSEM data showed excellent film coating quality and good filling performances for both isolated and dense areas without any voids, as shown SEM pictures below.

Comparative Example 4

Example 9 was repeated without the polymer of Synthesis Example 1, and the Via filling experiment of example 10 was repeated with this formulation. XSEM data showed no good filling and a lot of voids present in the Vias.

Example 11 Via Filling Performance Evaluation

The solution of Example 7, targeting a final film thickness of 250 nm, was spin-coated on a deep Via substrate at a spin speed of 1500 rpm. The Via wafer used had 650 nm deep Vias with 70, 80, 90, and 100 nm Via size. The Vias were spaced in semi-dense and isolated pattern with respectively hole to space ratios of 1:1, 1:1.4 and 1:6. The coated wafer was subsequently baked at 250° C./60 s and 400° C./120 s. The XSEM data showed excellent film coating quality and good filling performances for both isolated and dense areas without any voids.

Comparative Example 5

The solution of Example 7 was repeated without the polymer additive of Synthesis Example 1 and example 11 was repeated with this formulation. XSEM data showed no good filling and a lot of voids present in the Vias.

Example 12 Via Filling Performance Evaluation and Thermal

The solution of Example 7 with the targeted for a final film thickness of 250 nm was spin-coated on a deep Via substrate at a spin speed of 1500 rpm. The Via wafer used had 650 nm deep Vias with 70, 80, 90, and 100 nm Via size. The Vias were spaced in semi-dense and isolated pattern with respectively hole to space ratios of 1:1, 1:1.4 and 1:6. The coated wafer was subsequently baked at 250° C./60 s and 400 C/7200 s. The XSEM data showed excellent film coating quality and good filling performances for both isolated and dense patterns without any voids.

Example 13 Via Filling Performance Evaluation

The solution of Example 9 with the targeted for a final film thickness of 250 nm was spin-coated on a deep Via substrate at a spin speed of 1500 rpm. The Via wafer used had 650 nm deep Vias with 70, 80, 90, and 100 nm Via size. The Vias were spaced in semi-dense and isolated pattern with respectively hole to space ratios of 1:1, 1:1.4 and 1:6. The coated wafer was subsequently baked at 250° C./60 s and 400° C./120 s. The XSEM data showed excellent film coating quality and good filling performances for both isolated and dense patterns without any voids.

Example 14 Via Filling Performance Evaluation and Thermal Stability

The solution of Example 9 with the targeted for a final film thickness of 250 nm was spin-coated on a deep Via substrate at a spin speed of 1500 rpm. The Via wafer used had 650 nm deep Vias with 70, 80, 90, and 100 nm Via size. The Vias were spaced in semi-dense and isolated pattern with respectively hole to space ratios of 1:1, 1:1.4 and 1:6. The coated wafer was subsequently baked at 250° C./60 s and 400° C./7200 s. The XSEM data showed excellent film coating quality and good filling performances for both isolated and dense patterns without any voids.

Example 15 ZrO2 wt. % of Coatings with Nanoparticle:Polymer Wt Ratio 1:1 and Coatings with a Wt Ratio 7:3. Measure by TGA Si wafers were coated with Nanoparticle:Polymer solution as per Examples 5 (7:3 ratio) or Example 10 (1:1) ratio using the bakes as depicted in these Examples. The Coated wafers were then scraped and the film collected and analyzed by TGA. The Scraped film is tested for TGA using the following conditions: First the film is baked for 1 min at 50° C., then the Temperature is ramped from 50° C. to 800° C. at 120° C./min. Finally the film is heated for 60 min at 800° C. under oxygen Table 2 summarizes the TGA data. These

TABLE 2

| | wt. % ZrO$_2$ Determined by TGA | |
|---|---|---|
| Example | ZrO$_2$ wt. % (Zr wt. %) Initial scraped film prepared by 250° C./60 sec coating Bake | ZrO$_2$ wt. % (Zr wt. %) Initial scraped film prepared by 400° C./60 sec coating Bake |
| Example 5 (7:3) | 62.00 (45.88) | 67.55 (50.00) |
| Example 10 (1:1) | 45.50 (33.67) | 52.30 (38.70) |

Summary of Example Results

Coatings of hard masks only formulation containing metal oxide nanoparticles (Example 4) gave very low skrinkage compared to coatings based on a a metal oxide carboxylate (comparative example 1) which showed a very large shrinkage (Table 1).

Good Coatings and good Via filling properties (Examples 5-14) were obtained with mixtures comprised of the high carbon polymer, metal oxide nanoparticles. These were compared to formulations which did not contain the high carbon polymer component (comparative examples 2-5) which showed poor via film coating ability. Moreover, hard mask coatings based upon a blend of metal oxide nanoparticles and the high carbon polymer showed metal oxide content (wt. % ZrO$_2$) when bakes at 400° C. greater than 50 wt. % (Table 2).

What is claimed is:

1. A coating composition comprising an organic solvent, metal oxide nanoparticles dispersed in the organic solvent, and a high carbon polymer dissolved in the organic solvent,
wherein the high carbon polymer comprises:
(i) a repeat unit of structure (1):

(1)

wherein $R_1$ and $R_2$ are independently selected from the group of hydrogen, an alkyl and a substituted alkyl;

(ii) a hydroxybiphenyl repeat unit of structure (2):

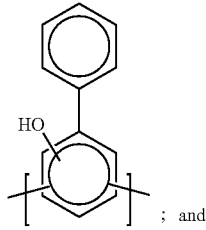
(2)

and (iii) a moiety containing a fused aromatic moiety of structure (3):

(3)

wherein Ar is an unsubstituted or substituted fused aromatic ring and $X_1$ is an alkylene spacer or a direct valence bond;

wherein the composition is comprised of 1 wt. % to 20 wt. % of the high carbon polymer.

2. The coating composition of claim 1, wherein the high carbon polymer comprises a unit represented by structure (4):

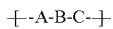
(4), wherein A has structure (3), B has structure (1) and C has structure (2).

3. The coating composition of claim 1, wherein $X_1$ in structure (3) is an alkylene spacer.

4. The coating composition of claim 1, wherein $X_1$ in structure (3) is a direct valence bond.

5. The coating composition of claim 1, wherein said fused aromatic moiety has structure (3a):

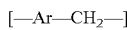
(3a).

6. The composition of claim 1, wherein said fused aromatic containing moiety has structure (3b):

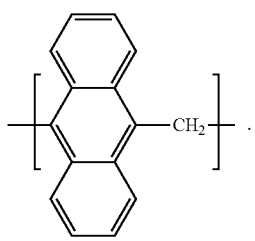
(3b)

7. The composition of claim 1, wherein said fused aromatic containing moiety Ar is a fused aromatic ring and $X_1$ is a direct valence bond.

8. The composition of claim 1, wherein said fused aromatic containing moiety Ar has 2 to 5 aromatic rings and $X_1$ is a direct valence bond.

9. The composition of claim 1, wherein the high carbon polymer further comprises a unit of structure (5):

(5)

wherein Ar' is a fused aromatic ring which has 2 to 5 aromatic rings.

10. The composition of claim 1, wherein the high carbon polymer structure (1) has structure (1a):

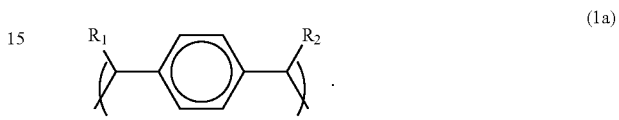
(1a)

11. The composition of claim 1, wherein the high carbon polymer structure (2) has structure (2a):

(2a)

12. The composition of claim 1, wherein said metal oxide nanoparticles are selected from the group consisting of Zirconium oxide nanoparticles, Hafnium oxide nanoparticles, Aluminum oxide nanoparticles, Tungsten nanoparticles, Titanium oxide nanoparticles, Copper oxide nanoparticles, Cuprous oxide nanoparticles, Tin oxide nanoparticles, Cerium oxide nanoparticles, Indium Tin oxide nanoparticles, Zinc oxide nanoparticles, Yttrium oxide nanoparticles, Lanthanum oxide nanoparticles and Indium oxide nanoparticles.

13. The composition of claim 1, wherein the composition is comprised of 5 wt. % to 20 wt. % of metal oxide nanoparticles.

14. The composition of claim 1, having a wt. ratio of the metal oxide nanoparticles to the high carbon polymer ranges from 50:50 to 99:1.

15. A process of coating a hard mask composition on a substrate comprising steps a) and b):
   a) applying a composition comprising an organic solvent, metal oxide nanoparticles dispersed in the organic solvent and a high carbon polymer dissolved in the solvent onto a substrate to form a hard mask film, wherein the high carbon polymer comprises:
   (i) a repeat unit of structure (1):

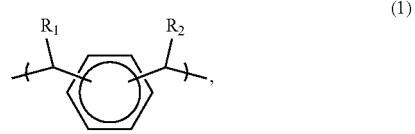
(1)

wherein R₁ and R₂ are independently selected from the group of hydrogen, an alkyl and a substituted alkyl;

(ii) a hydroxybiphenyl repeat unit of structure (2):

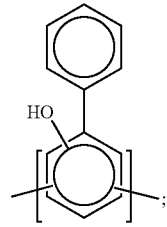
(2)

and (iii) a moiety containing a fused aromatic moiety of structure (3):

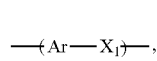
(3)

wherein Ar is an unsubstituted or substituted fused aromatic ring and X₁ is an alkylene spacer or a direct valence bond; and b) baking the hard mask film.

16. The process of claim 15, wherein the substrate is a patterned substrate comprising topographical features, and the coating of the hard mask composition overlays said topographical features and further wherein, after baking the film in step b), the process further comprises step c):

c) removing the hard mask film overlaying the topographical features of the patterned substrate with a chemical stripper or with a fluorinated plasma etch.

17. The process of claim 15 further comprising the steps c3) to h3):

c3) coating a bottom antireflective coating on top of the hard mask film, d3) coating a photoresist on top of said bottom antireflective coating, e3) patterning the photoresist forming a photoresist pattern, f3) etching through the bottom antireflective coating not protected by the photoresist pattern down to the hard mask coating with a fluorinated plasma, g3) etching through the hard mask layer not protected by the bottom antireflective coating and photoresist down to the silicon substrate with a chlorine plasma producing a patterned hard mask film, and h3) etching with a fluorinated plasma into the silicon substrate in those area not protected by the patterned hard mask film producing topographical features into the silicon features.

18. A coating composition comprising an organic solvent, metal oxide nanoparticles dispersed in the organic solvent, and a high carbon polymer dissolved in the solvent, wherein the high carbon polymer comprises:

(i) a repeat unit of structure (1):

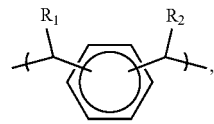
(1)

wherein R₁ and R₂ are independently selected from the group of hydrogen, an alkyl and a substituted alkyl;

(ii) a hydroxybiphenyl repeat unit of structure (2):

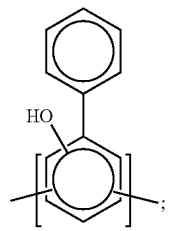
(2)

and (iii) a moiety containing a fused aromatic moiety of structure (3):

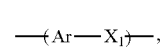
(3)

wherein Ar is an unsubstituted or substituted fused aromatic ring and X₁ is an alkylene spacer or a direct valence bond;

wherein the composition has a wt. ratio of the metal oxide nanoparticles to the high carbon polymer that ranges from 50:50 to 99:1.

19. The coating composition of claim 18, wherein the high carbon polymer comprises a unit represented by structure (4):

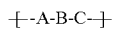
(4), wherein A has structure (3), B has structure (1) and C has structure (2).

20. The coating composition of claim 18, wherein X₁ in structure (3) is an alkylene spacer.

21. The coating composition of claim 18, wherein X₁ in structure (3) is a direct valence bond.

22. The coating composition of claim 18, wherein said fused aromatic moiety has structure (3a):

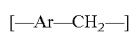
(3a).

23. The composition of claim 18, wherein said fused aromatic containing moiety has structure (3b):

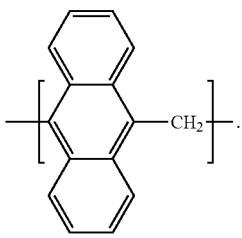
(3b)

24. The composition of claim 18, wherein said fused aromatic containing moiety Ar is a fused aromatic ring and $X_1$ is a direct valence bond.

25. The composition of claim 18, wherein said fused aromatic containing moiety Ar has 2 to 5 aromatic rings and $X_1$ is a direct valence bond.

26. The composition of claim 18, wherein the high carbon polymer further comprises a unit of structure (5):

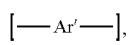
(5)

wherein Ar' is a fused aromatic ring which has 2 to 5 aromatic rings.

27. The composition of claim 18, wherein the high carbon polymer structure (1) has structure (1a):

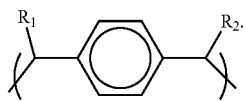
(1a)

28. The composition of claim 18, wherein the high carbon polymer structure (2) has structure (2a):

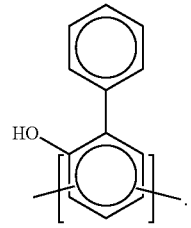
(2a)

29. The composition of claim 18, wherein said metal oxide nanoparticles are selected from the group consisting of Zirconium oxide nanoparticles, Hafnium oxide nanoparticles, Aluminum oxide nanoparticles, Tungsten nanoparticles, Titanium oxide nanoparticles, Copper oxide nanoparticles, Cuprous oxide nanoparticles, Tin oxide nanoparticles, Cerium oxide nanoparticles, Indium Tin oxide nanoparticles, Zinc oxide nanoparticles, Yttrium oxide nanoparticles, Lanthanum oxide nanoparticles and Indium oxide nanoparticles.

30. The composition of claim 18, wherein the composition is comprised of 5 wt. % to 20 wt. % of metal oxide nanoparticles.

31. The composition of claim 18, wherein the composition is comprised of 1 wt. % to 20 wt. % of the high carbon polymer.

* * * * *